(12) United States Patent
Heydler et al.

(10) Patent No.: US 7,093,205 B2
(45) Date of Patent: Aug. 15, 2006

(54) METHOD AND APPARATUS FOR EFFICIENT SEMICONDUCTOR PROCESS EVALUATION

(75) Inventors: Thomas Heydler, Danville, CA (US); Maria del Mar Hershenson, Palo Alto, CA (US)

(73) Assignee: Barcelona Design, Inc., Sunnyvale, CA (US)

( * ) Notice: Subject to any disclaimer, the term of this patent is extended or adjusted under 35 U.S.C. 154(b) by 191 days.

(21) Appl. No.: 10/412,535

(22) Filed: Apr. 10, 2003

(65) Prior Publication Data

US 2004/0015787 A1    Jan. 22, 2004

Related U.S. Application Data

(60) Provisional application No. 60/372,340, filed on Apr. 10, 2002.

(51) Int. Cl.
*G06F 17/50* (2006.01)
(52) U.S. Cl. .................. 716/1; 716/3; 716/5
(58) Field of Classification Search ............. 716/1–4, 716/5
See application file for complete search history.

(56) References Cited

U.S. PATENT DOCUMENTS

| | | | |
|---|---|---|---|
| 4,827,428 A | 5/1989 | Dunlop et al. | |
| 5,055,716 A | 10/1991 | El Gamel | |
| 5,289,021 A | 2/1994 | El Gamel | |
| 5,402,358 A | 3/1995 | Smith et al. | |
| 5,633,807 A | 5/1997 | Fishburn et al. | |
| 5,754,826 A | 5/1998 | Gamel et al. | |
| 5,973,524 A | 10/1999 | Martin | |
| 6,002,860 A | 12/1999 | Voinigescu et al. | |
| 6,269,277 B1 * | 7/2001 | Hershenson et al. | .......... 700/97 |
| 6,311,145 B1 | 10/2001 | Hershenson | |
| 6,311,315 B1 | 10/2001 | Tamaki | |
| 6,321,367 B1 | 11/2001 | Chun et al. | |
| 6,381,563 B1 | 4/2002 | O'Riordan et al. | |
| 6,425,111 B1 * | 7/2002 | del Mar Hershenson | ...... 716/4 |
| 6,532,569 B1 | 3/2003 | Christen et al. | |
| 6,539,533 B1 | 3/2003 | Brown, III et al. | |
| 6,574,786 B1 | 6/2003 | Pohlenz et al. | |
| 6,577,992 B1 | 6/2003 | Tcherniaev et al. | |

(Continued)

FOREIGN PATENT DOCUMENTS

GB    2 131 228 A    6/1984

(Continued)

OTHER PUBLICATIONS

Saha, S K., "Managing technogoy CAD for competetive adavantage: an efficient approach for integrated circuit fabrication technologoy development" IEEE Tansactions (continued) . . . On Engineering Managment, vol. 46, No. 2, May 31, 1999, pp. 221-229, IX002317707, ISSN: 0018-9391.

(Continued)

*Primary Examiner*—Vuthe Siek
*Assistant Examiner*—Magid Y. Dimyan
(74) *Attorney, Agent, or Firm*—Blakely, Sokoloff, Taylor & Zafman

(57) ABSTRACT

A method is described that involves automatically generating a physical behavior curve from a process description; where, the process description describes a process. The method also involves automatically generating a device model for the process from the physical behavior curve; where, the device model is represented in geometric form. The method also involves attempting to automatically generate, with the device model and with a geometric optimization sequence, a circuit design for the process.

30 Claims, 19 Drawing Sheets

U.S. PATENT DOCUMENTS

| | | | |
|---|---|---|---|
| 6,578,179 | B1 | 6/2003 | Shirotori et al. |
| 6,581,188 | B1 | 6/2003 | Hosomi et al. |
| 2002/0112214 | A1* | 8/2002 | Keller et al. .................... 716/4 |
| 2003/0097246 | A1* | 5/2003 | Hara et al. ..................... 703/14 |
| 2003/0191611 | A1 | 10/2003 | Hershenson et al. |
| 2004/0027206 | A1 | 2/2004 | Colleran et al. |
| 2004/0040001 | A1* | 2/2004 | Miller et al. .................... 716/4 |
| 2004/0073879 | A1* | 4/2004 | Chen et al. ..................... 716/8 |
| 2004/0172609 | A1 | 9/2004 | Hassibi et al. |

FOREIGN PATENT DOCUMENTS

WO        WO 01/37429 A1     5/2001

OTHER PUBLICATIONS

Duvivier F., et al., "Worst-case SPICE model generation for a process in development using Athena, Atlas, Utmost and Spyn" ICM '2001 Proceedings 13th International Conference on Microelectronics (IEEE CAT. No. 01EX481) Oct. 31, 2001, pp. 11-18, XP002317709, ISBN: 0-7803-7522-X.

Mediero, F., et al., "A Vertically Integrated Tool For Automated Design Of Sigma Delta Modulators", IEEE Journal of Solid-State Circuits, vol. 30., No. 7, Jul. 1, 1995, pp. 762-767.

Hershenson, M., et al., "Optimal Design Of A CMOS Op-Amp Via Geometric Programming", IEEE Transactions On Computer Aided Design Of Integrated Circuits And Systems, vol. 20., N. Jan. 1, 2001, pp. 1-21.

Mandal, P., et al., "CMOS Op-Amp Sizing Using A Geometry Programming Formulation", IEEE Transactions On Computer Aided Design Of Integrated Circuits And Systems, vol. 20., No. 1, Jan. 31, 2001, pp. 22-38.

Daems, W., et al., "Simulation-based Automatic Generation Of Signomial And Posynomial Performance Models For Analog Integrated Circuit Sizing", IEEE/ACM International Conference On Computer-Aided Design, Nov. 4, 2001, pp. 70-74.

Von Kaenel, V., et al., "A 320MHz, 1.5mW at 1.36V CMOS PLL For Microprocessor Clock Generation", IEEE Solid-State Circuits Conference, Nov. 9, 1996, Digest of Technical Papers, 42nd ISSCC96/ Session 8 / Digital Clocks and Latches / Paper FA 8.2.

Chan, et al., "Analysis of Linear Networks and Systems," Addison-Wesley Publishing Company, 1972, pp. 23-25 and 46-57.

Young, et al., "A PLL Clock Generator with 5 to 110 MHz of Lock Range for Microprocessor", IEEE Journal of Solid-State Circuits, vol. 27, No. 11, Nov. 1992, pp. 1599-1607.

Novof, et al., "Fully Integrated CMOS Phase-Locked Loop with 15 to 240 MHz Locking Range and ± 50 ps Jitter", IEEE Journal of Solid-State Circuits, vol. 30., No. 11, Nov. 1995, pp. 1259-1266.

Mohan, et al., "Simple Accurate Expressions for Planar Spiral Inductances", IEEE Journal of Solid-State Circuits, vol. 34, No. 10, Oct. 1999, pp. 1419-1424.

Hershenson, "CMOS Analog Circuit Design Via Geometric Programming", A Dissertation Submitted to the Department of Electrical Engineering and the Committee on Graduate Studies of Stanford University, Nov. 1999, 241 pages.

Hershenson, M., et al., "Optimization of Inductor Circuits via Geometric Programming", pp. 994-998, Design Automation Conference, Jun. 21, 1999, Proceedings.

Hershenson, M., et al., "Automated Design of Folded-Cascode Op-Amps with Sensitivity Analysis", pp. 121-124, Electronics, Circuits and Systems, IEEE International Conference on LISBOA, Sep. 7-10, 1998.

Gielen, G., et al., "An Analogue Module Generator For Mixed Analogue/Digital ASIC Design", International Journal of Circuit Theory and Applications, vol. 23, pp. 269-283, 1995.

Kortanek, K.O., et al., "An Infeasible Interior-Point Algorithm For Solving Primal And Dual Geometric Programs," pp. 155-181, Mathematical Programming Society, Inc., 76:155-181, Jan. 1, 1995.

Hershenson, M., et al., "GPCAD: A Tool for CMOS Op-Amp Synthesis" 8 pages, Proceedings of the IEEE/ACM International Conference on Computer Aided Design (ICCAD), pp. 296-303, Nov. 1998.

Hershenson, M., et al., "Posynomial models for MOSFETs" 9 pages, Jul. 7, 1998.

Chang, H, et al., "A Top-Down, Constraint-Driven Design Methodology for Analog Integrated Circuits" 6 pages, IEEE 1992 Custom Integrated Circuits Conference.

Chavez, J., et al, "Analog Design Optimization: A Case Study" 3 pages, IEEE, Jan. 1993.

Geilen, G., et al., "Analog Circuit Design Optimization Based on Symbolic Simulation and Simulated Annealing", pp. 707-713, IEEE Journal of Solid-State Circuits, vol. 25, No. 3, Jun. 1990.

Fishburn, J, et al., "TILOS: A Posynomial Programming Approach to Transistor Sizing" pp. 326-328, IEEE, 1985.

Maulik, P., et al., "Integer Programming Based on Topology Selection of Cell-Level Analog Circuits", 12 pages, IEEE Transactions On Computer-Aided Design Of Integrated Circuits And Systems, vol. 14, No. 4, Apr. 1995.

Swings, K., et al., "An Intelligent Analog IC Design System Based On Manipulation Of Design Equations" pp. 8.6.1-8.6.4, IEEE 1990, Custom Integrated Circuits Conference.

Nesterov, Y., et al., "Interior-Point Polynomial algorithms in Convex Programming" 8 pgs., 1994, Society for Industrial and Applied mathematics.

Yang, H.Z., et al., "Simulated Annealing Algorithm with Multi-Molecule: an Approach to Analog Synthesis" pp. 571-575, IEEE, 1996.

Wong, D.F., et al., "Simulated Annealing For VLSI Design" 6 pages, 1998, Kulwer Academic Publishers.

Maulik, P., et al., "Sizing of Cell-Level Analog Circuits Using Constrained Optimization Techniques" pp. 233-241, IEEE Journal of Solid-State Circuits, vol. 28, No. 3, Mar. 1993.

Ochotta, E, et al., "Synthesis of High-Performance Analog Circuits in ASTRX/OBLS" pp. 273-295, IEEE Transactions on Computer-Aided Design of Integrated Circuits And Systems, vol. 15, No. 3, Mar. 1996.

Wright, S., "Primal-Dual Interior-Point Methods" pp. 1-3, http://www.siam.org/books/wright, Printed Aug. 19, 1998.

Shyu, J., et al., "Optimization-Based Transistor Sizing" pp. 400-408, IEEE Journal of Solid-State Circuits, vol. 23, No. 2, Apr. 1998.

Wright, S., "Primal-Dual Interior-Point Methods" 14 pages, 1997, Society for Industrial and Applied Mathematics.

Van Laarhoven, P.J.M., et al., "Simulated Annealing: Theory and Applications" 26 pages, 1987, Kulwer Academic Publishers.

Hershenson, M., et al., "CMOS Operational Amplifier Design and Optimization via Geometric Programming" pp. 1-4, Analog Integrated Circuits, Stanford University.

Aguirre, M.A., et al., "Analog Design Optimization by means of a Tabu Search Approach" pp. 375-378.

Medeiro, F., et al., "A Statistical Optimization-Based Approach for Automated Sizing of Analog Cells", pp. 594-597, Dept. of Analog Circuit Design.

Spatnekar, S., "Wire Sizing as a Convex Optimization Problem: Exploring the Area-Delay Tradeoff" 27 pages, Dept. of Electrical and Computer Engineering.

Su, H., et al., "Statistical Constrained Optimization of Analog MOS Circuits Using Empirical Performance Models" pp. 133-136.

Vassiliou, I., et al, "A Video Driver System Designed Using a Top-Down, Constraint-Driven Methodology" 6 pages.

Sapatnekar, S, et al., "An Exact Solution to the Transistor Sizing Problem for CMOS Circuits Using Convex Optimization" 35 pages.

Bowman, R., "An Imaging Model For Analog Macrocell Layout Generation", IEEE Internation Symposium On Circuits And Systems, vol. 2, May 8, 1989, pp. 1127-1130, XP010085007.

Hunter, A., et al., "Combining Advanced Process Technology and Design for Systems Level Integration", IEEE Proceedings, pp. 245-250, First International Symposium On Quality Electronic Design, Mar. 20, 2000.

* cited by examiner

701 {
- M1 = PMOS; GATE WIDTH = $W_1$; GATE LENGTH = $L_1$
- M2 = PMOS; GATE WIDTH = $W_2$; GATE LENGTH = $L_2$
- M3 = NMOS; GATE WIDTH = $W_3$; GATE LENGTH = $L_3$
- M4 = NMOS; GATE WIDTH = $W_4$; GATE LENGTH = $L_4$
- M5 = PMOS; GATE WIDTH = $W_5$; GATE LENGTH = $L_5$
- M6 = NMOS; GATE WIDTH = $W_6$; GATE LENGTH = $L_6$
- M7 = PMOS; GATE WIDTH = $W_7$; GATE LENGTH = $L_7$
- M8 = PMOS; GATE WIDTH = $W_8$; GATE LENGTH = $L_8$ $I_{BIAS}$ = I AMPS $R_C$ = R OHMS $C_C$ = C FARADS

702 {
- 1 = $V_{DD}$; M8$_{SOURCE}$; M5$_{SOURCE}$; M7$_{SOURCE}$
- 2 = M1$_{GATE}$
- 3 = M2$_{GATE}$
- 4 = $C_{C1}$; M6$_{DRAIN}$; M7$_{DRAIN}$
- 5 = M5$_{GATE}$; M7$_{GATE}$; M8$_{GATE}$; $I_{BIAS\,1}$
- 6 = M1$_{SOURCE}$; M2$_{SOURCE}$; M5$_{DRAIN}$
- 7 = M1$_{DRAIN}$; M3$_{DRAIN}$; M3$_{GATE}$; M4$_{GATE}$
- 8 = M2$_{DRAIN}$; $R_{C1}$; M4$_{DRAIN}$; M6$_{GATE}$
- 9 = $R_{C2}$; $C_{C2}$
- 10 = $V_{SS}$; $I_{BIAS\,2}$; M3$_{SOURCE}$; M4$_{SOURCE}$; M6$_{SOURCE}$

METHOD AND APPARATUS FOR EFFICIENT SEMICONDUCTOR PROCESS EVALUATION

CLAIM OF PRIORITY

The present application hereby claims the benefit of the filing date of a related Provisional Application filed on Apr. 10, 2002, and assigned Application Ser. No. 60/372,340.

COPYRIGHT PERMISSION

A portion of the disclosure of this patent document contains material which is subject to (copyright or mask work) protection. The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever.

FIELD OF INVENTION

The field of invention relates generally to circuit design; and, more specifically, to a method and apparatus for efficient semiconductor process evaluation.

BACKGROUND

FIG. 1 demonstrates a basic methodology that is often employed when a semiconductor manufacturing process (which may also be referred to as a "process" or a "semiconductor process") is evaluated. A semiconductor manufacturing process is usually evaluated in order to understand whether or not a particular circuit design can be fabricated with the process in question; or, what functional characteristics or limits might apply if a particular circuit design is fabricated by the process in question. According to the methodology of FIG. 1, device models that describe characteristics of the various types of devices (e.g., transistors) manufactured by the process in question are provided to a designer (e.g., what drain-to-source current can be expected for a particular gate-to-source voltage and drain-to-source voltage); who, through considerable manual efforts, designs 101 a circuit with the device models.

That is, specific features of the design are articulated only as a result of conscious decision making on the part of the designer based upon his/her design objectives; and, his/her knowledge of the device model particulars. For example, the gate width of a particular transistor may be manually determined in light of a drain-to-source current that is desired by the designer for the transistor; and, a transconductance-per-unit-gate-width parameter for the transistor that is defined (or can be derived from) the device model for the transistor. As such, the present day design approach 101 often involves the designer having to consciously make trade-offs between his/her design goals and the capabilities of the process.

During the design phase 101 a design is usually formulated through the construction of a "netlist". A netlist is a data format that lists the nodes in the design's circuitry network and the device components connected thereto (e.g., a transistor's gate, a transistor's source, a first capacitor electrode, etc.). Device features are also usually specified (such as the width of a transistor's gate, etc.) In order to verify that a design's operation conforms to specific functional requirements (or to observe the effects of a design "experiment"), a design's operation can be simulated 102 with a software tool that uses the netlist as basis for performing the simulation. The simulation results may include waveforms that are expected to appear on a particular node as well as frequency response characteristics.

A problem with the traditional design flow is that it is heavily dependent on the designer's manual efforts which can consume long periods of time. As a consequence, evaluating a number of different potential manufacturing processes for a particular design is inefficient because an attempt has to be made at developing a working design for each process to be evaluated. Given the manual efforts associated with each design 101 attempt, the number of potential processes that are entertained for a particular design (and/or the number of process that can be evaluated) are often limited to a select few.

FIGURES

The present invention is illustrated by way of example and not limitation in the figures of the accompanying drawings, in which like references indicate similar elements and in which:

FIG. 7a shows an embodiment of a transistor level netlist for an operational amplifier;

FIG. 7b shows a transistor level circuit topology for the operational amplifier described by the netlist of FIG. 7a;

Figure 13:
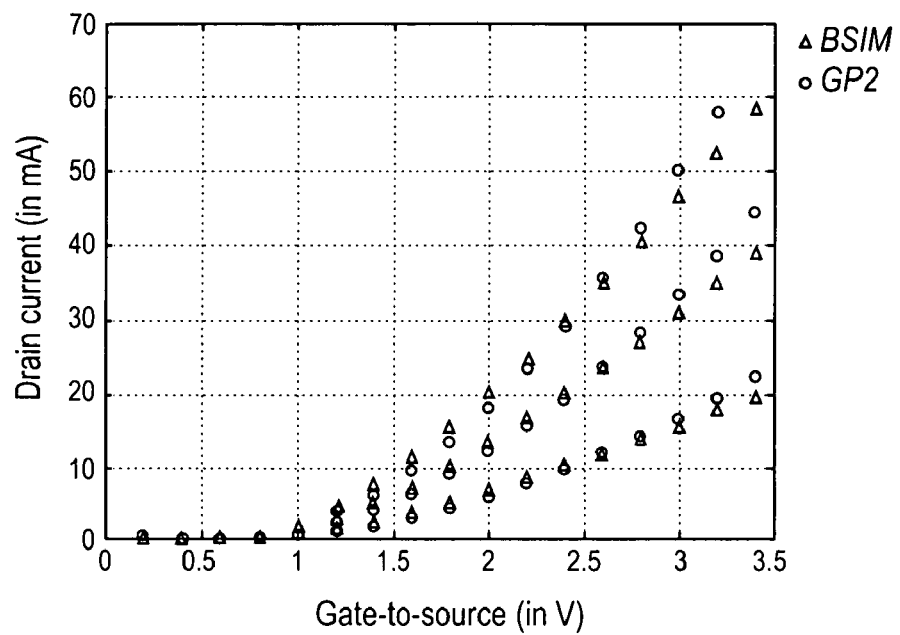
Figure 14:
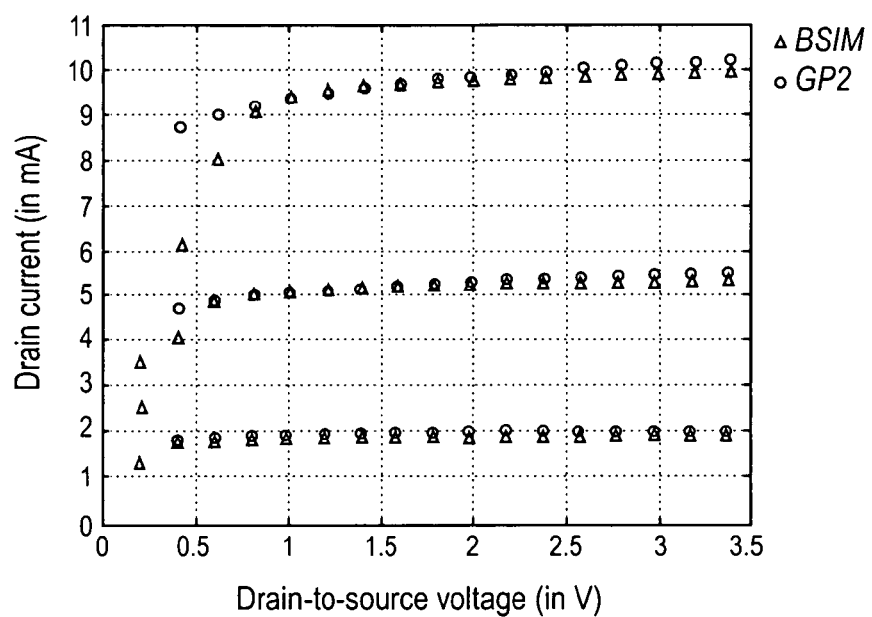
Figure 15:
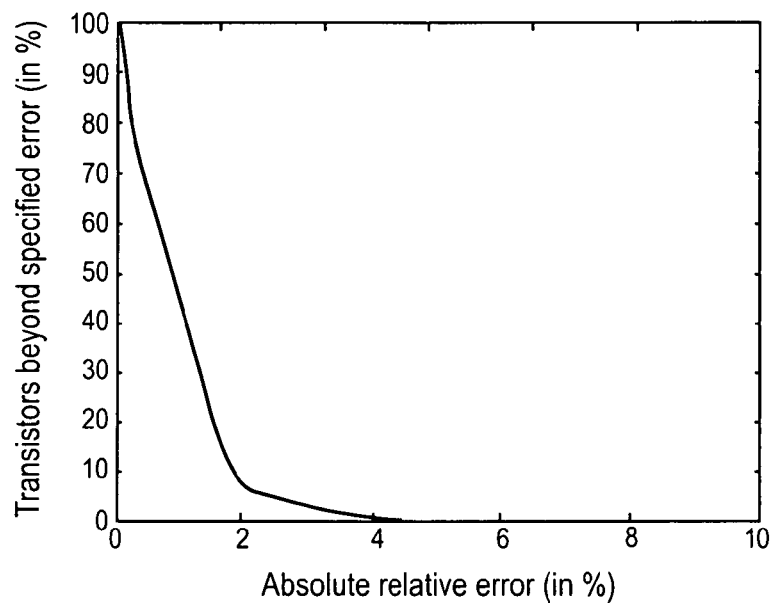
Figure 16:
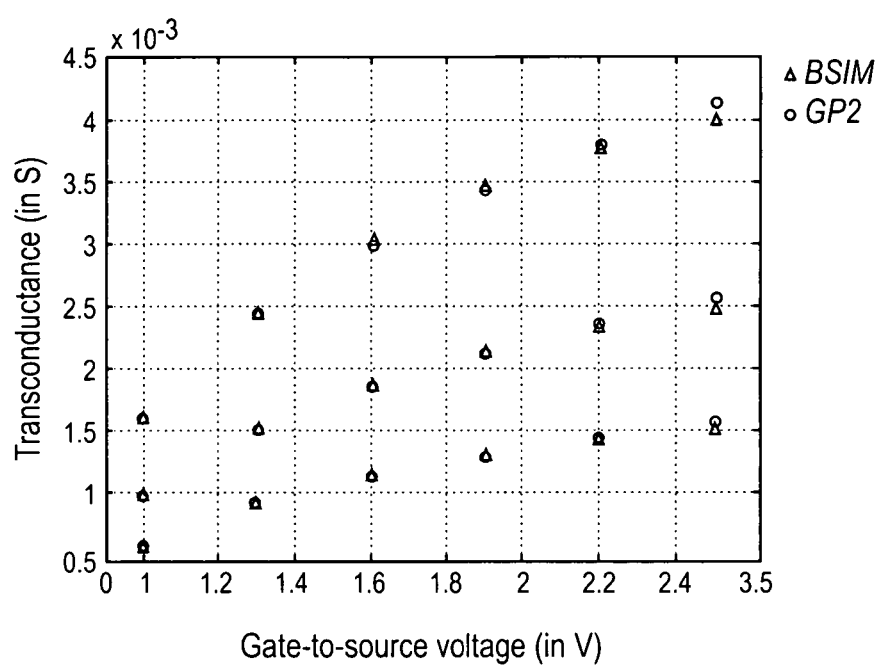
Figure 17:
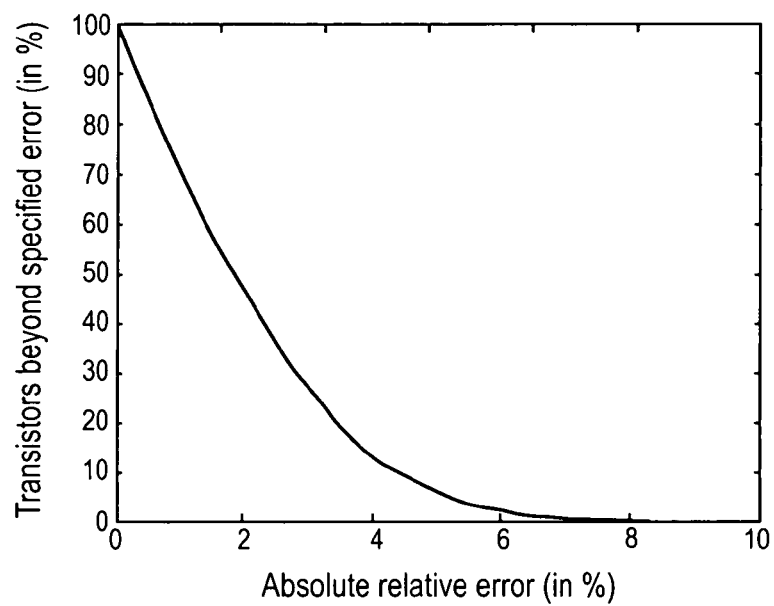
Figure 18:
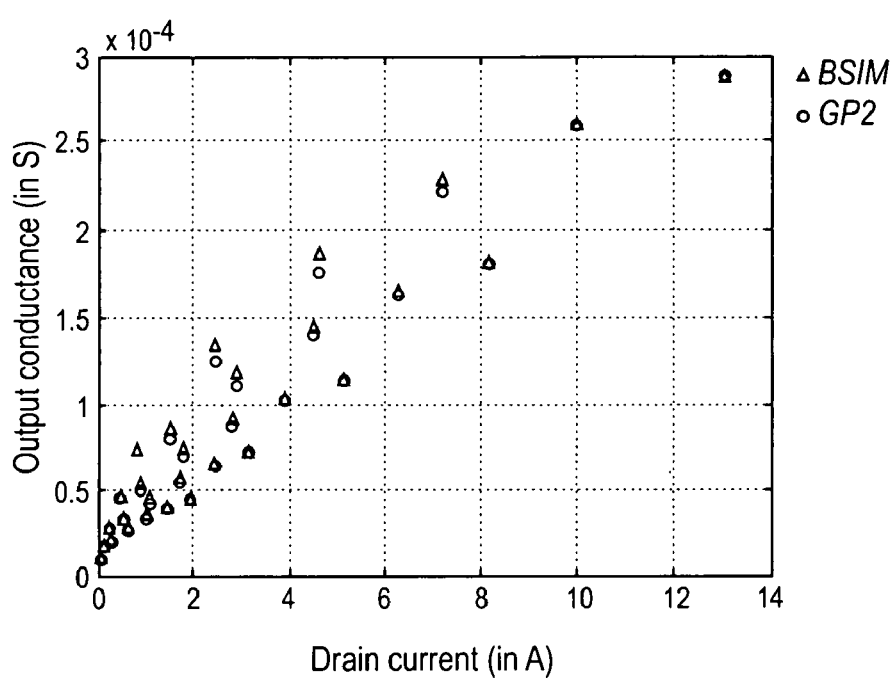

FIG. 13 shows drain current versus gate-to-source voltage for NMOS transistors of length 1 um, width 100 um, 200 um and 300 um, and drain to source voltage of 2.5V is a 0.5 um CMOS technology;

FIG. 14 shows an IV curve for an NMOS transistor in a 0.5 um CMOS technology of length 1 um and width 200 um;

FIG. 15 shows error distribution for the GP2 model of the transconductance of an NMOS transistor in a 0.5 um CMOS technology when compared to SPICE simulations with BSIM3v1 models;

FIG. 16 shows transconductance of an NMOS transistor in 0.5 um CMOS technology for widths 10 um, 17 um, and 28 um;

FIG. 17 shows error distribution for the GP2 model of the output conductance of an NMOS transistor in a 0.5 um CMOS technology when compared to SPICE simulations with BSIM3v1 models;

FIG. 18 shows output conductance of an NMOS transistor in 0.5 um CMOS technology for widths 10 um, 17 um, 28 um, 46 um, and 77 um.

DETAILED DESCRIPTION

In the following specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

1.0 Discussion of Efficient Process Evaluation Techniques

Figure 1:
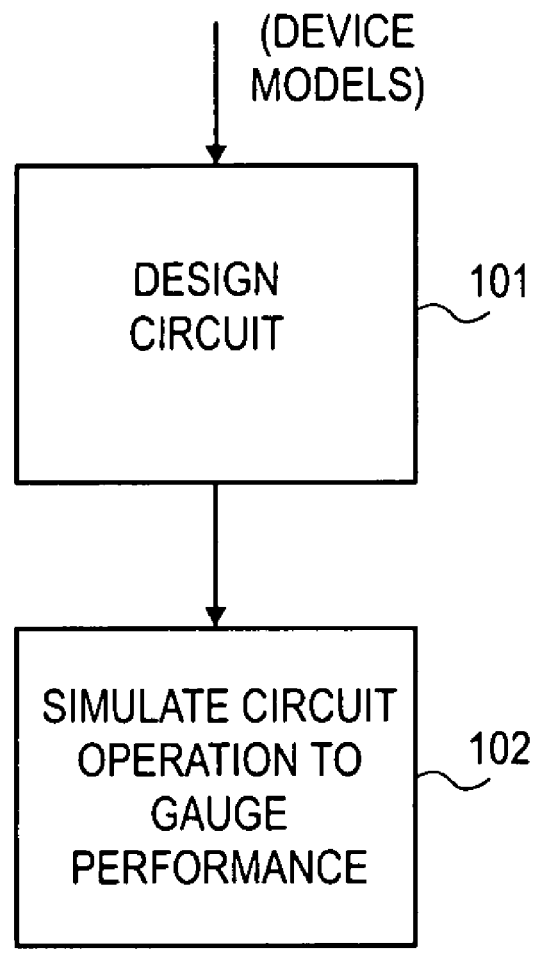
FIG. 1 shows a traditional design flow.
Figure 2:
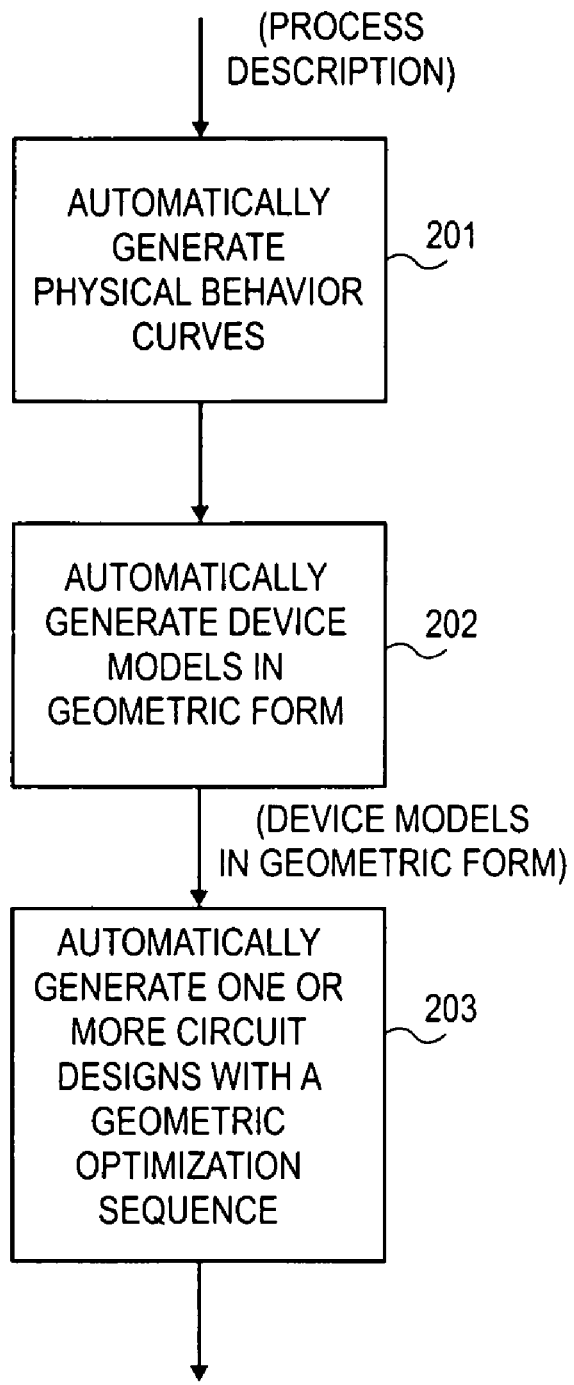
FIG. 2 shows an improved design flow.

FIG. 2 shows an embodiment of a basic design flow that can be used to reduce the risks associated with evaluating a semiconductor process. As such, the design flow of FIG. 2 can be used to efficiently evaluate a proposed process change; or, efficiently evaluate a large number of different processes and/or designs. According to the approach of FIG. 2, a series of physical behavior curves are automatically generated 201 from a description of a semiconductor manufacturing process. A physical behavior curve describes a relationship between at least a pair of parameters for a semiconductor device or structure. Examples include, for example "current-voltage" (IV) curves and "capacitance-voltage" (CV) curves.

In the case of field effect transistors (FETs) (such as those fabricated by complementary metal oxide semiconductor (CMOS) FET manufacturing processes), a transistor can be characterized at least in part by tracing out various IV curves such as: 1) drain-to-source current vs. applied drain-to-source voltage for each of one or more applied gate voltages; 2) gate current vs. gate-to-source voltage; 3) gate current vs. drain-to-source voltage. FETs may also be further characterized by tracing out various CV curves such as capacitance vs. applied drain-to-source voltage for each of one or more applied gate voltages. Same or similar IV and CV curves may also be used to characterize other semiconductor devices such as resistors or capacitors.

The process description that acts as an input to the automatic physical behavior curve generation methodology 201 can be viewed as a summary or other articulation of a semiconductor manufacturing process recipe. A typical automatic physical behavior curve methodology 201 constructs a representation of a "structure" that is formed by the recipe (e.g., a transistor, resistor, capacitor, etc.) and then performs a two-dimensional or three dimensional analysis of the structure to generate the physical behavior curves that characterize it. Here, in order to generate a family of physical behavior curves for a structure formed by a particular manufacturing process, the automatic physical behavior curve generation methodology 201 makes use of solid-state device theory to relate specific structural (e.g., transistor, resistor, capacitor) characteristics (e.g., as embodied in the family of IV curves) to specific semiconductor processing parameters and/or process techniques.

Note that the term "automatic" can be construed to mean "with software". Software tools that automatically generate physical behavior curves in light of a semiconductor process description are generally referred to in the art as Technology Computer Aided Design (TCAD) tools and may be purchased on the open market; or, may possibly be obtained in a proprietary environment. For example, the Athena™ and Atlas™ tools offered by Silvaco International of Santa Clara, Calif. TCAD are an commercially available option. Within proprietary environments, various semiconductor manufacturers may possess "in house" software that can relate a description of one of their processes to the physical behavioral curve(s) of the various devices that it produces. We also note that as alternate embodiments to automatically generating physical behavior curves with a specific software tool dedicated to producing such curves from a process recipe, a designer may choose to use actually measured data from actually manufactured structures for the physical behavior curves; or, may obtain physical behavior curves from structure SPICE models.

Once the physical behavior curves have been automatically generated 201 from the process description, device models are automatically generated 202. A device model describes the characteristics of a structure (which may also be referred to as a device) with mathematical equations that attempt to "fit" the structure's physical curves. Thus, in a typical case, the device models produced by methodology 202 corresponds to mathematical equations that "fit" the fit the data points provided by methodology 201.

According to the methodology observed in FIG. 2, the device models are also presented in geometric form. To say that a mathematical equation is in geometric form means that a geometric optimization problem can be formulated with the mathematical equation. As such, a geometric optimization problem can be formulated with the automatically generated 202 device models. A discussion of geometric optimization problem solving is provided in more detail below in section 2.0 of this detailed description.

Techniques for automatically generating device models that are presented in geometric form are already known. Appendices A and B of the present application provide a general discussion of fitting to a monomial or posynomial form (Appendix A); and, a more specific discussion of geometric fitting for an FET device (Appendix B). Appendices A and B are found in Section 3.0 of this detailed description. Additional techniques are also described in U.S. Pat. No. 6,425,111 B1 entitled "Saturation Region Transistor Modeling For Geometric Programming" and issued on Jul. 23, 2002 which is hereby incorporated by reference. To the extent that any definitions or other descriptions found in Appendices A and B of Section 3.0 or U.S. Pat. No. 6,425,111 B1 conflict with those provided in Sections 1.0 or 2.0 of the detailed description of the present application, the definitions or descriptions found in Sections 1.0 or 2.0 of the detailed description of the present application shall be deemed controlling.

Note that techniques to automatically generate 202 a device model may be embodied with commercially available or proprietary software tools. An example of a commercially available tool is the Miro™ Clocking Engine offered by Barcelona Design, Inc. of Newark, Calif.

Once geometric device models have been automatically generated 202, one or more circuit designs are automatically developed with a geometric optimization sequence 203. A geometric optimization sequence is a methodology that "sets up" and solves a geometric optimization problem; where, a geometric optimization problem is a type of optimization problem having a special mathematical format. Various expressions that conform to the special format, along with various techniques and/or features that may be associated with setting up a geometric problem, are discussed in more detail below in Section 2.0 of this Detailed Description. For the present discussion, however, it is sufficient to recognize that the geometric optimization problem, when solved, provides a circuit design that is specially tailored for the manufacturing process represented by the device models.

The designed circuit can not only be a specific type of circuit (e.g., a phase locked loop (PLL), an analog-to-digital Converter (ADC), an amplifier, etc.,); but can also have functional characteristics (e.g., a bandwidth of 800–900 MHz, power consumption of less than 50 mW, a gain of 20–25 dB, etc.) that were particularly "designed for" by the setting up and solving of the geometric problem. Here, again as described in more detail below, special equations that describe the specific type of circuit; and, that are numerically constrained by the desired functional characteristics, are used to set-up the geometric optimization problem. These equations may be pre-configured and recalled from a database as needed. The device model equations introduce limitations mandated by the process; and, being in geometric form, also contribute to the formulation of the geometric problem.

The geometric optimization problem solving methodology typically attempts to "optimize" the specific type of circuit design with respect to at least one of its characteristics, functional or otherwise (e.g., bandwidth, semiconductor surface area consumption, etc.). Note that one or more circuit design types may be automatically designed 203. For example, a first family of equations may be geometrically solved to produce a design for a first type of circuit (e.g., a PLL); then, a second family of equations may be geometrically solved to produce a design for a second type of circuit (e.g., an ADC); then, a third family of equations may be geometrically solved to produce a design for a third type of circuit (e.g., an amplifier). Alternatively, or in combination, different designs may be generated for a same circuit type.

For example, a first family of equations may be geometrically solved to produce a design for a particular type of circuit having a first set of functional characteristics (e.g., an amplifier having a first gain); then, a second family of equations may be geometrically solved to produce a second design for the same type of circuit but having a second set of functional characteristics (e.g., an amplifier having a second gain); then, a third family of equations may be geometrically solved to produce a third design for the same type of circuit but having a third set of functional characteristics (e.g., an amplifier having a third gain). Barcelona Design, Inc. of Newark, Calif. presently offers a software tool (currently named Miro™ Clocking Engine and Picasso™ OpAmp) that can be used to automatically generate 203 one or more circuit designs in a fashion that is consistent with the discussion provided just above.

Figure 3:
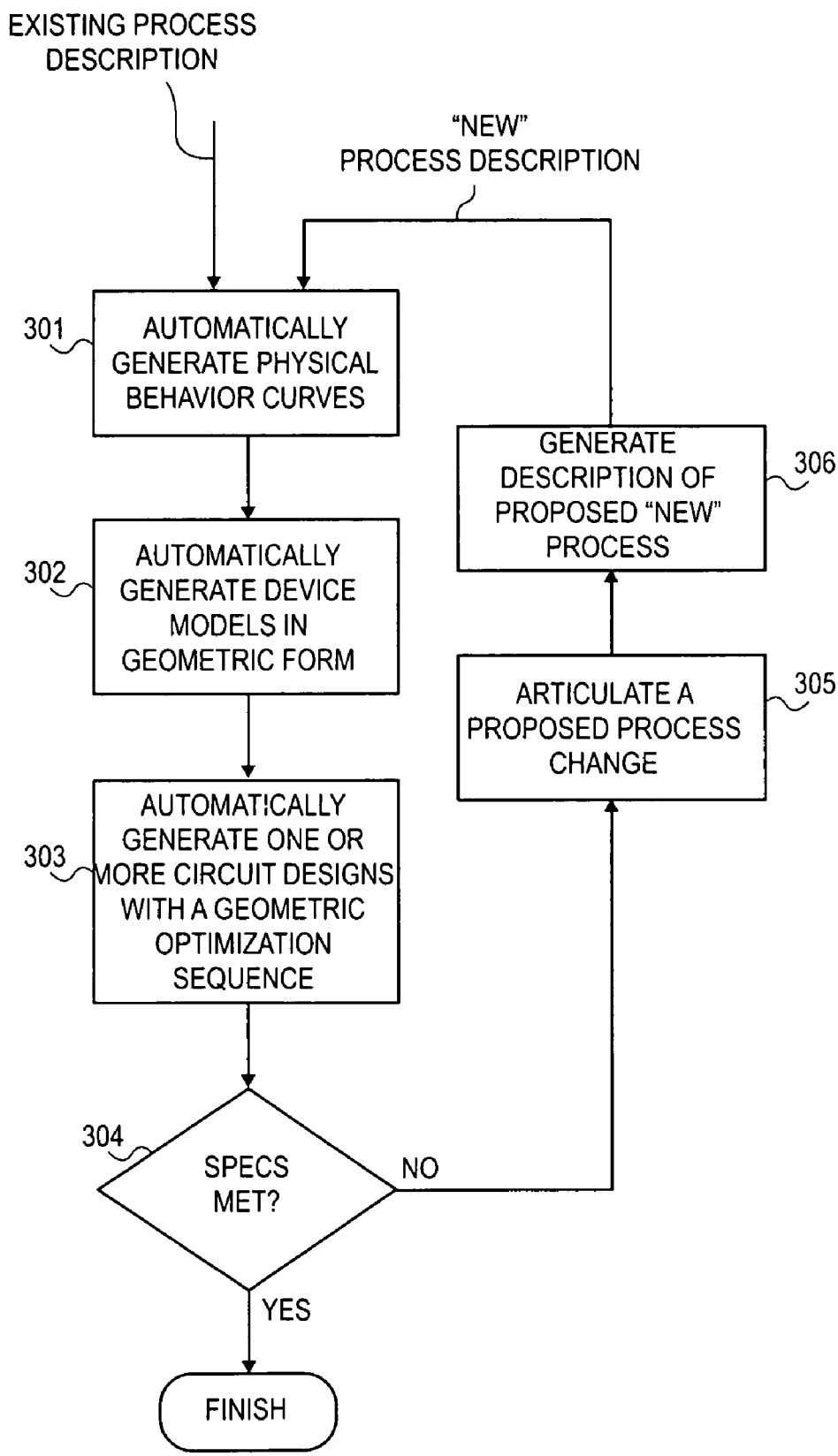
FIG. 3 shows a design flow that efficiently takes into account a manufacturing process change.

To review the methodology of FIG. 2, one or more designs can be automatically generated for a particular semiconductor manufacturing process in response to the submission of an appropriate description of the process. Given the high degree of automation, the amount of time consumed developing the one or more designs should be less than prior art approaches. Furthermore, because the design flow of FIG. 2 rapidly converts a process description into one or more designs specifically tailored for the process, proposed changes to a process can be readily evaluated. FIG. 3 demonstrates a flow that can be used for this purpose.

The design flow of FIG. 3 includes the automatic generation 301 of physical behavior curves (e.g., IV curves, CV curves, etc.), the automatic generation 302 of device models poised in geometric form, and the automatic generation 303 of one or more circuit designs with a geometric optimization sequence as described with respect to FIG. 2. In FIG. 3, however, the resulting designs are analyzed 304; and, if a proposed process change can be articulated 305, a description of the "new" process is generated 306 and the basic flow 301, 302, 303 is repeated. Note that actually manufacturing a prototype is not necessary; and, as a result, a proposed "new" process can be evaluated with reduced exposure to scheduling and/or economic risk(s). Any analysis 304 for gauging the performance of the designed 303 circuit(s) may be used to conceive or otherwise generate a process change 305.

For example, one characteristic of a geometric problem solving sequence is that if a "solution" does not exist (i.e., a circuit can not be designed having the particular functional characteristics that were "deigned for") no circuit will be created. Here, a process related reason as to why the circuit could not be designed may be realized (e.g., through manual attempts to design similar circuits having slight modifications relative to the unsuccessful attempt; a theoretical analysis, etc.) so that a specific process change can be articulated. For example, to illustrate a few possible scenarios, if it is determined that the design could not be realized because the transconductance of a transistor was too small, the designer may propose a new channel dopant concentration (to raise the transistor's gain); or, if it is determined that the design could not be realized because the source/drain contact resistances of a transistor were too large, the designer may propose wider source/drain contacts or a new source/drain contact material (to lower the transistor's contact resistance).

Alternatively, automatically developed designs may be thoroughly simulated (e.g., where SPICE models derived from the applicable process's physical behavior curves are used instead of the geometric models). The simulation analysis may reveal waveform integrity issues (e.g., jitter) that can be addressed with process changes (e.g., as discussed in the preceding paragraph). Regardless as to how the analysis 304 is carried out, the design flow of FIG. 3 allows for any number of loops so that multiple proposed process changes can be individually evaluated. Recall from the discussion of FIG. 2 that one or more circuit design types may be automatically designed 203; or, alternatively, or in combination, different designs may be generated 203 for a same circuit type.

Figure 4:
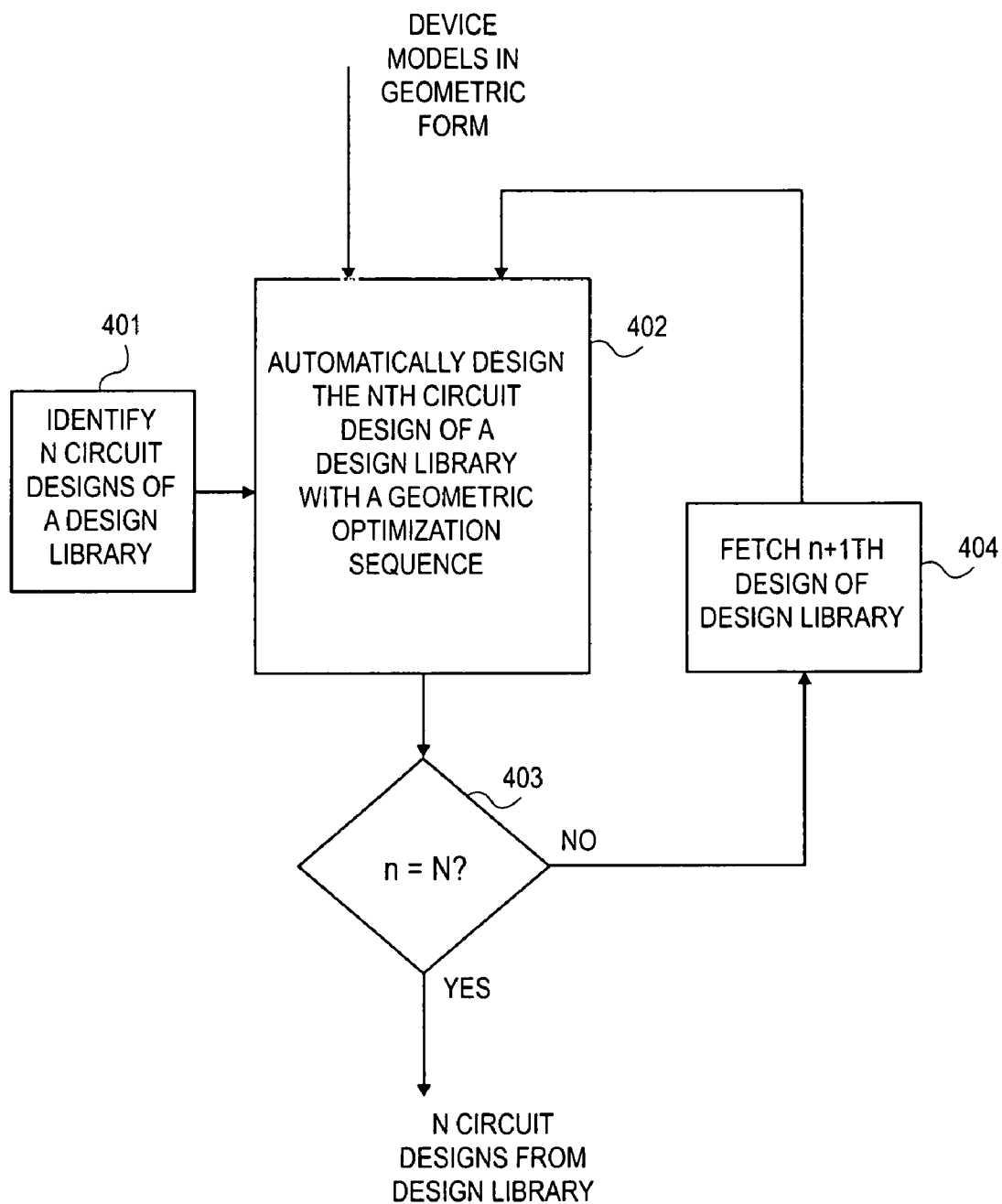
FIG. 4 shows a design flow that automatically designs a number of different circuits for a particular manufacturing process.

Any of these approaches correspond to the production of multiple designs. FIG. 4 shows a methodology that can be used to generate multiple designs with a basic geometric optimization sequence 402. As such, the methodology of FIG. 4 may be viewed as an embodiment of the automatic design methodology 203 of FIG. 2. Here, the basic geometric optimization sequence 402 may be viewed as a "kernel" of functionality that cannot provide all the designs in a single execution. As such, multiple executions of the kernel 402 (e.g., as achieved through multiple iterations) are used to automatically generate all of the desired designs. The basic geometric optimization sequence 402 of FIG. 4, as an example, can "set up" a single geometric problem and then solve it so as to produce a single design.

Here, because of the singular nature of the problem solving process, N iterations are performed in order to generate N designs. In an embodiment, N different design types from a "library" are automatically designed. A library is a collection of design types, the idea being that some design types are popular in their usage and therefore may be reused. As such, by pulling a file for a particular design type from a library, the time spent developing equations for a particular design type can be avoided. For example, a design library may include different design types such as a PLL, an ADC, an amplifier, etc. By automatically designing different design types from a library, the impact of a particular proposed process change (for example) on an entire library can be studied/analyzed. In an embodiment N corresponds to every design file in the library.

In other embodiments N may correspond to less than every design file in the library such that a smaller subset of the designs in the library are automatically designed. Note that which particular N designs from the library are to be automatically designed may be indicated 401 beforehand so that the software can determine which design file is to be fetched 404 for each iteration. Here, design files (e.g., embodied as equations in geometric form that describe a particular circuit type) may be fetched 404 from a database that stores design files. The design files may already be embodied in a constrained form (so that the desired functional characteristics of the design are pre-configured); or reference may be made to another file that embodies the constraints which are then merged with the unconstrained equations. Again an embodiment of a basic geometric optimization sequence is described in more detail in Section 2.0 of the present application. Note that other multi-design approaches are also possible. For example, multiple kernels may be run "in parallel" (e.g., simultaneously); or, a series of single design "kernels" may be tied in series so that multiple designs are formed per iterative loop.

Figure 5:
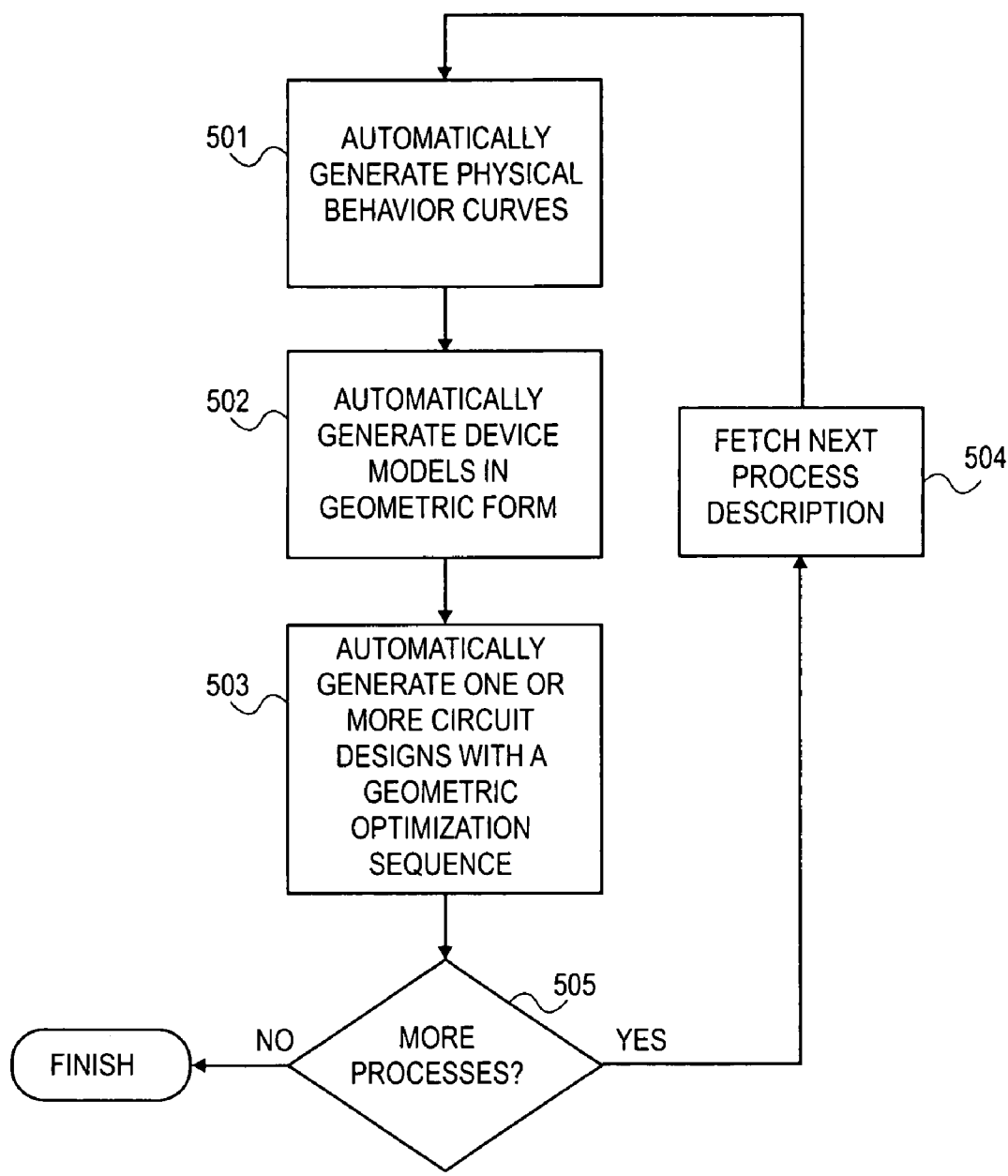
FIG. 5 shows a design flow that produces a plurality of like designs where each design is targeted for a different manufacturing process.

FIG. 5 shows another design flow that allows different processes to be easily compared with one another. The design flow of FIG. 5 includes the automatic generation 501 of physical behavior curves, the automatic generation 502 of device models poised in geometric form, and the automatic generation 503 of one or more circuit designs with a geometric optimization sequence as described with respect to FIGS. 2 and 3. Unlike the methodology of FIG. 3, however, where a process change 305 and "new" process description 306 is entertained for each loop iteration, the design flow of FIG. 5 fetches 504 a pre-existing process description with each loop 505 iteration. The design flow of FIG. 5 may be useful, for example, if a number of different processes are being considered; and, a thorough analysis as to how each of the different process can handle a number of different designs is desired.

For example, in one scenario, a number of different semiconductor foundries may be considered as "the plan of record" for an entire product line (e.g., where the entire product line includes a selection of different design types (e.g., PLLs, ADCs, amplifiers, etc.)). With the methodology of FIG. 5, each design associated with the product line (e.g., where the product line comprises one or more libraries or portion(s) thereof) can be automatically designed 503 with each iteration. A process description for the standard manufacturing process of each manufacturer being considered is maintained (e.g., in a database); and, a different one of these is fetched 504 for each iteration. With each iteration, the design of the entire product line for a particular manufacturer's process will be produced. An analysis of each designed product line can be used to evaluate the various strengths and weaknesses of each process with respect to its ability to manufacture the entire product line.

Figure 6:
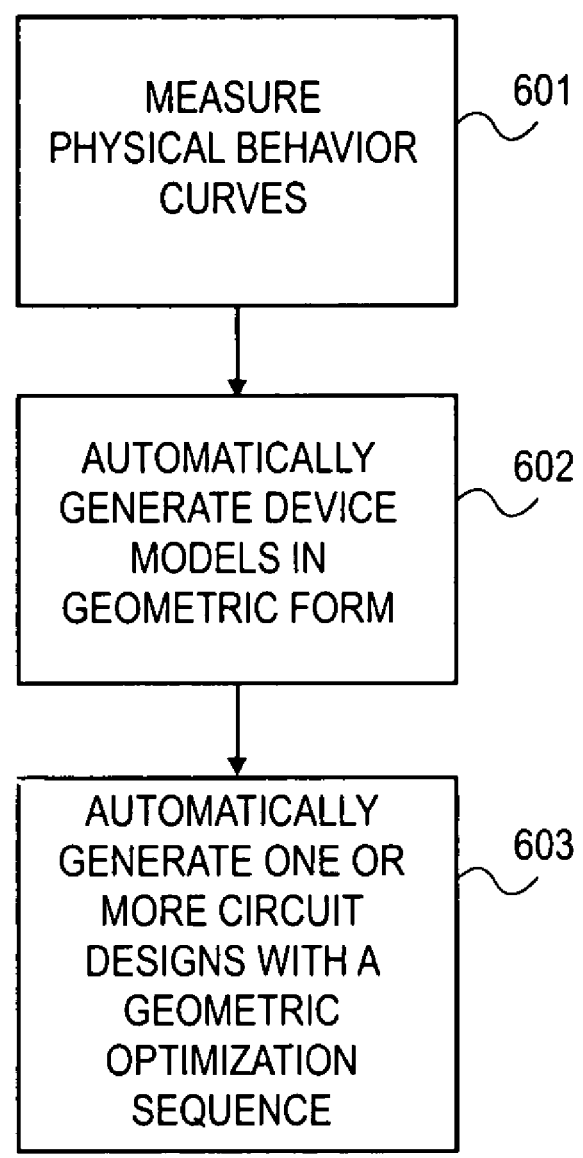
FIG. 6 shows another design flow that can be added to any of the design flows observed in FIGS. 3, 4, and 5.

Note that the design flows of FIGS. 3 and 5 may be mixed with one another as appropriate. For example, if a number of different processes are being compared with one another via a design flow that resembles FIG. 5 (e.g., as discussed just above in the preceding scenario); and, one of these processes is considered to be particularly promising "if" it were able to be modified slightly; then, the design flow of FIG. 3 may be employed to study/verify the impact of the process change. FIG. 6 shows another design flow that can be executed by itself or may be mixed with either of the design flows of FIGS. 3 and 5. The design flow of FIG. 6 includes the automatic generation 602 of device models poised in geometric form, and the automatic generation 603 of one or more circuit designs with a geometric optimization sequence as described with respect to FIGS. 2, 3 and 5. However, the design flow of FIG. 6 is based upon actual physical behavior curve measurements 601 (e.g., as measured in a laboratory with actual semiconductor wafers) rather than a software tool that "postulates" the physical behavior curves based upon a process description.

As such, whereas the "input" to the design flow of FIG. 3 is a process description, the "input" to the design flow of FIG. 5 is an actual device/structure (e.g., transistor, resistor, capacitor) whose physical behavior characteristics can be measured. The design flow of FIG. 6 may be used, for example, to follow up the design flow of FIG. 3. For example, if a run through of the methodology of FIG. 5 indicates that a particular process change might be very promising, the designer may decide that an actual "wafer fab" of prototype samples is warranted. After wafer fabrication, these wafers may be measured 601 in a laboratory so that more accurate physical behavior curves (than those that were automatically generated by a TCAD tool) can be developed. As a result, even more accurate device models can be generated 602; and, even more efficient designs can be formulated 603. Similarly, the design flow of FIG. 6 may follow the design flow of FIG. 5 (e.g., to more accurately model a process that was "selected" amongst a plurality of processes that were evaluated with the design flow of FIG. 5).

2.0 Discussion of Geometric Programmimg

The following description discusses various techniques for an automated circuit design process where geometric optimization is employed. Generally, completion of an automated circuit design process may be realized once a transistor level netlist has been formed. A transistor level netlist, as described in the background, is a listing of the nodes (i.e., "nets") in a circuit to be manufactured; and, for each node, a specification of each of the device components that are connected to that node (e.g., a transistor gate, a transistor source, a transistor drain, a first electrode of a capacitor, a second electrode of a capacitor, a first electrode of a resistance, a second electrode of a resistance, etc.). Netlists may also list the devices themselves that are part of the circuit design (e.g., transistors, resistors, capacitors).

For each identified transistor, the netlist also specifies relevant transistor dimensions. For example, with respect to circuit designs targeted for a Complementary Metal-Oxide-Semiconductor (CMOS) field effect transistor manufacturing process, a transistor level netlist should define the gate length and gate width of each transistor. An example of a transistor level netlist 700 for an operational amplifier ("op-amp" or "op amp" or "opamp") is observed in FIG. 7a. The corresponding transistor level circuit design 750 of the op-amp to which the netlist 700 of FIG. 7a pertains is observed in FIG. 7b.

Note that a listing of each of the transistors M1 through M8 is provided in field 701 of the netlist 700; and, a listing of each of nodes 1 through 10 is observed in field 702 of the netlist. Note also that, for each of the transistors specified in field 701 of the netlist 700, the gate length and gate width have been specified. Furthermore, as seen in the exemplary netlist 700 of FIG. 7a, note that other specifics are provided for such as specific resistance values and capacitance values (which may alternatively be described in terms of their dimensions), etc. It is important to point that the netlist 700 observed in FIG. 7a (as well as those presented throughout the application) is an exemplary embodiment. As such, other netlists may be readily created by those of ordinary skill having different organization and/or format than that observed in FIG. 7a.

Figure 7B:
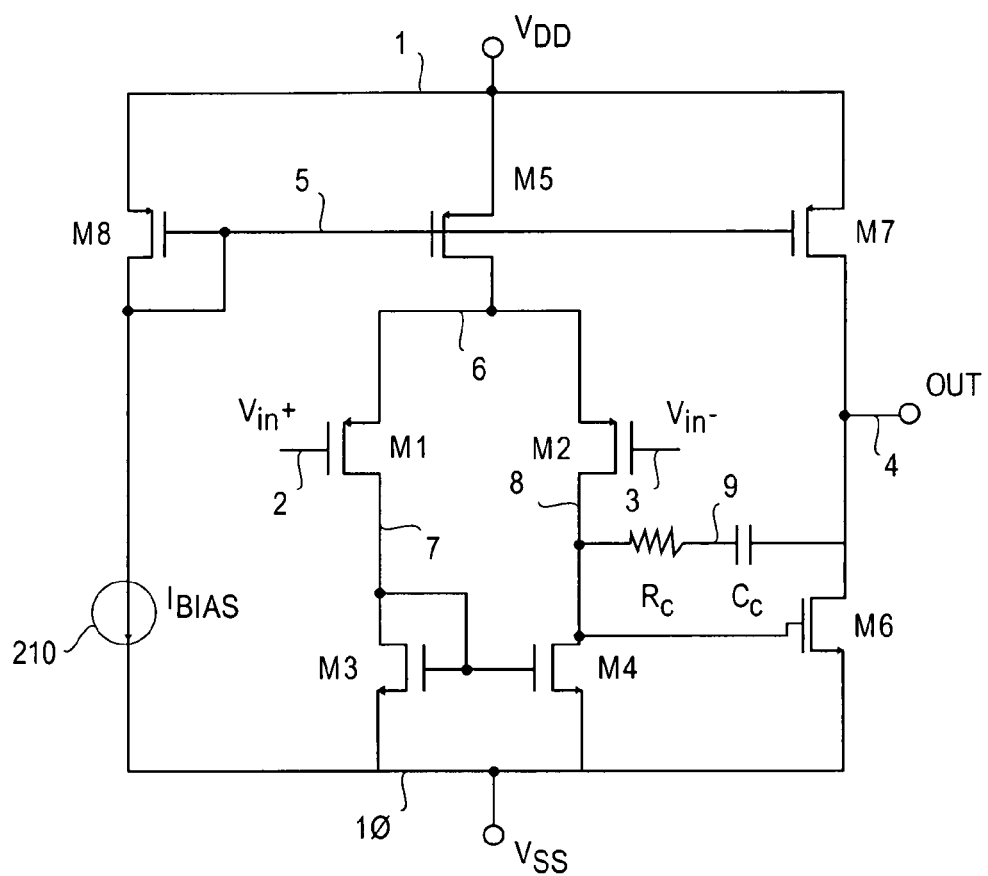

Heretofore, it has been appreciated that geometric programming can be used to rapidly define specific transistor dimensions (such as gate width and gate length) for a particular transistor level circuit design (such as the op-amp observed in FIG. 7b). For example, as described in U.S. Pat. No. 6,269,277 B1 entitled "System and Method for Designing Integrated Circuits" and issued on Jul. 31, 2001, specific transistor dimensions (as well as specific resistance and capacitance values) can be automatically determined for an operational amplifier based upon designer articulated functional characteristics of the operational amplifier.

For example, if a user desires the operational amplifier to have an open loop gain of CdB, a unity gain bandwidth of $DMH_Z$, a slew rate of E V/nsec (to list just a few of the functional characteristics for an op amp), a software program may be used to mathematically relate the functional characteristics of the operational amplifier to specific transistor dimensions (and resistance and capacitance values) through "geometric programming". Use of the term "geometric" in the present discussion refers to the use of equations that are expressed in monomial or posynomial form so that a geometric optimization problem can be constructed and/or solved in software.

A monomial equation is an equation in the form of $$cx_1^{\alpha 1} x_2^{\alpha 2} \ldots x_n^{\alpha n} \quad \text{EQN. 1}$$

where $x_1, x_2, \ldots x_n$ are real, positive variables; $c \geq 0$; and, $\alpha_i$ is real. A posynomial equation is an equation in the form of $$\sum_{k=1}^{t} c_k x_1^{\alpha 1k} x_2^{\alpha 2k} \ldots x_n^{\alpha nk} \quad \text{EQN. 2}$$

where $x_1, x_2, \ldots x_n$ are real, positive variables; $c_k \geq 0$; and, $\alpha_i$ is real. An example of an equation expressed in monomial form is $2.3(x_1/x_2)^{1.5}$ (where $c=2.3$, $\alpha_1=1.5$, $\alpha_2=-1.5$); and, an example of an equation expressed in posynomial form is $0.7+2x_1/x_3^2+x_2^{0.3}$ (where $c_1=0.7$, $\alpha_{11}=\alpha_{21}=\alpha_{31}=0$; $c_2=2$, $\alpha_{12}=1$, $\alpha_{22}=0$, $\alpha_{32}=-2$; $c_3=1$, $\alpha_{13}=0$, $\alpha_{23}=0.3$, $\alpha_{33}=0$).

Typically, a plurality of monomial and/or posynomial equations are collected or otherwise identified so that one of the equations can be "optimized" (e.g., maximized or minimized) so as to identify specific numeric values for the constituent variables associated with the equations used to construct and solve a geometric problem. For example, continuing with the example of the operational amplifier of FIGS. 7a and 7b, the power consumption, silicon surface area consumption, open loop gain, unity gain bandwidth, phase margin, and slew rate of the operational amplifier (as well as other functional characteristics of the operational amplifier) could each be described with a different monomial or posynomial equation.

As just one example of these, the open loop gain of the op amp could be expressed in monomial form as:

$$A_O = KI_{BIAS}(W_2 W_6 L_7 W_8 L_5 W_8 / L_2 L_6 W_7 L_8 W_5 L_8)^{0.5} \quad \text{EQN. 3}$$

where: 1) K is a constant obtainable by those or ordinary skill; 2) $I_{BIAS}$ is the current drawn by the current source 710 of the op amp of FIG. 7b; 3) W is the gate width of the transistor that the applicable subscript identifies; and; 4) L is the gate length of the transistor that the applicable subscript identifies. Here, other monomial or posynomial equations that each express a specific op amp characteristic (such as those listed in the preceding paragraph (as well as others)) in terms of variables that correspond to transistor gate dimensions (or other parameters that can be converted into specific transistor dimensions as described in more detail below) can be "collected" so that the collection of equations represents a family of equations that, together, describe (in monomial and/or posynomial form) the operational amplifier as a whole.

Once a group of appropriate monomial equations and/or posynomial equations are collected, specific numeric values (i.e., "constraints") may be specified for the particular functional characteristic that each of the equations describe. In a common approach, one of the equations is not provided a specific numeric constraint so that it can be optimized (in respect of the numeric constraints applied to the other equations) through a geometric solving process. That is, in this case, the geometric problem may be constructed according to the following definition:

Minimize: monomial or posynomial equation_z    EQN. 4

Subject to:

constrained form of monomial equation_1 constrained form of monomial equation_2

:

constrained form of monomial equation_X

AND constrained form of posynomial equation_1 constrained form of posynomial equation_2

:

constrained form of posynomial equation_Y

Here, the "family" of posynomial and monomial equations used to describe the circuit (such as the op amp referred to above) include equation z (which may be from the group of monomial equations in the family or from the group of posynomial equations in the family). As such, there are X+Y+1 total equations in the family of equations; one of which is to be optimized, the remainder of which are constrained.

As an example, if specific numeric "target" values (or ranges) are articulated for each of the op amp characteristics other than silicon surface area consumption (e.g., power $\leq 35$ mW, open loop gain $\geq 10^6$; unity gain bandwidth $\geq 100$ MHz; phase margin $\geq 60°$; slew rate $\geq 2.5$ v/nsec), a geometric optimization problem can be constructed and solved wherein the solution corresponds to the minimum silicon surface consumption for the particular numeric constraints that were articulated. Better said, in the geometric problem model provided just above, the equation for silicon surface area consumption corresponds to "equation_z"; and, the remaining equations that describe the functional characteristics of the op amp correspond to the group of X+Y equations within the family that have been numerically constrained.

As such, if the equation for silicon surface area consumption is expressed in terms of specific transistor dimensions, the solution to the geometric problem (once the geometric problem is solved) will specify specific transistor dimensions that not only correspond to the minimum area of the op amp that may be achieved but also correspond to an op amp having the specific numeric constraints that were articulated. Here, with respect to the automatic generation of circuit designs that was discussed relative to FIGS. 2 through 6, according to various embodiments, various numerical constraints may already be pre-defined before the automatic circuit design generation 203, 303, 503, 603 is attempted. As such, the target functional characteristics of the designs may be largely defined at the onset; and, the optimization problem that is actually solved during the geometric problem solving sequence attempts to optimize a particular variable (e.g., minimize surface area consumption).

Before continuing, note that above cited geometric problem is just one type of geometric problem. For example, other geometric problems may choose to allow one or more equations (that take part in the problem solving process) to be unconstrained and neither maximized nor minimized. Generally, geometric problems are optimization problems that employ posynomial and/or monomial equations (that may be expressed in convex form or otherwise as explained in more detail below). The reader is referred to Duffin, Peterson and Zener "Geometric Porgramming—Theory and Application", John Wiley & Sons, New York/London/Sydney, 1967 for more details regarding the various forms by which an optimization problem may be expressed in geometric form.

Regardless as to the specific form in which a geometric optimization problem is stated, note that the manner in which that form is obtained (e.g., the techniques or strategies used to develop a family of specific monomial and/or posynomial expressions) may be widely varied. For example, note that the $I_{BIAS}$ term that appeared above in the (monomial) expression for open loop gain (EQN. 3) may be further expressed in monomial or posynomial form in terms of the dimensions of its constituent transistors (which have been obviated from FIG. 7b for simplicity).

As such, such an expression for $I_{BIAS}$ could be: 1) directly substituted into EQN. 3 (so as to form an expression for open loop gain "completely" in terms of a constant and transistor dimensions); 2) "kept apart" as a separate equation that is included with the family of equations that take part in the geometric problem solving process (e.g., is one of the X+Y equations illustrated in EON. 4); or, 3) "kept apart" as a separate equation that is not included with the family of equations that take part in the geometric problem solving process (e.g., is not one of the X+Y equations illustrated in EON. 4).

In the former (first) case, the "variables" of the geometric optimization process (at least with respect to open loop gain) are limited to transistor dimensions as expressed in a single equation. In the middle (second) case, the "variables" of the geometric optimization process (at least with respect to open loop gain) are limited to transistor dimensions as expressed via a pair of equations (e.g., one for open loop gain and one for bias current). In the later (third) case, the "variables" of the geometric optimization process (at least with respect to open loop gain) include not only transistor dimensions but also the bias current $I_{BIAS}$ of the op amp current source.

In the later case, once an optimal value for $I_{BIAS}$ is obtained (e.g., as would naturally "fall out" as a result of a solution to a geometric problem where $I_{BIAS}$ was one of its variables), a separate following sequence (geometric or otherwise) could be used to determine specific transistor dimensions for those transistors used to construct the op amp current source 710. Thus, a complete description for the op amp could be obtained even if the posynomial and monomial equations that are used to construct a geometric problem are not expressed "solely" in terms of transistor dimensions. This feature may be taken advantage of, for example, in order to express performance characteristics in more traditional terms (e.g., where, in the case of op amps for example, important functional characteristics tend to be explained in terms of op amp bias current rather than the dimensions of the transistors that form the current source that provides the bias current).

The fact that the open loop gain of an op amp could be accounted for in a geometric programming environment by at least three different approaches has been mentioned above to bring to light some relevant properties regarding the application of geometric programming techniques to analog circuit design automation. Firstly, the specific organization as to which functional characteristics are expressed as a separate equation and/or which variables are chosen to take part in each equation (i.e., how each posynomial and monomial equation is particularly expressed) and/or which equations take part in a geometric problem solving sequence (and which equations simply "make use of" an optimization result) may vary from embodiment to embodiment. As such, for any circuit design, an automated design tool may employ any of a vast number of different, mathematical "paths" or "threads" in order to achieve a specific end result (e.g., transistor gate dimensions for the transistors within the circuit). Here, the simple case of op amp open loop gain has illustrated three unique mathematical paths that could be used.

Secondly, a second property that was touched upon by the former (first) approach (by which open loop gain was expressed completely in terms of transistor dimensions by substituting an expression for $I_{BIAS}$ into EQN. 3) is that posynomial or monomial equations may be "substituted" into other posynomial or monomial equations such that the resultant equation preserves a posynomial or monomial form. For example, if the equation for $I_{BIAS}$ is expressed in monomial form, its substitution into EQN. 3 would cause the resultant expression for open loop gain to also be in monomial from (since EQN. 3 is expressed in monomial form). Similarly, the substitution of a monomial expression into a variable of a posynomial expression allows the posynomial expression to remain in posynomial form; and, the substitution of a posynomial expression into a monomial expression causes the monomial expression to expand into a posynomial expression.

As such, recalling that a geometric optimization sequence is a methodology that "sets up" and solves a geometric optimization problem, the "setting up" of a geometric problem for a particular design may involve the execution of many "strings" or "threads" of mathematical substitutions where a lower level equation is typically substituted into a higher level equation; and where, each equation is typically devoted to describing some characteristic of the circuit to be designed. As such, each substitution drives the description of the circuit (as embodied in a family of equations) closer to the transistor level of detail (or even the manufacturing process level of detail). For example, an initial family of equations that describe functional characteristics for a type of circuit (e.g., a PLL, an ADC, etc.) may be used as starting point for setting up a geometric optimization problem.

Various portions of these equations may depend on the functional properties of "lower" level components that are used to construct the larger system (e.g., the charge pump of a PLL may have an operational amplifier as one of its subcomponent; and, the gain of the charge pump may depend on the gain of the operational amplifier). An equation describing a functional aspect of the lower level component (e.g., the gain of the operational amplifier as observed in EON. 3) may be substituted into the initial, higher level equation (e.g., that describes the gain of the charge pump) so that the description of the circuit type is brought closer to the transistor/process level (noting that EON. 3 describes gain in terms of transistor dimensions). Note that descriptions of specific resistors and capacitors may be deemed to be at a transistor level of detail.

Regardless, it is important to point out that (once a family of equations in monomial and/or posynomial form have been collected for a particular analog circuit) those of ordinary skill will be able to readily construct an appropriate geometric problem in software; and, furthermore create or use known methods to actually solve the geometric problem in software. For example, according to one type of approach referred to as the "convex" approach, logarithms of monomial and posynomial expressions (whose variables are expressed as exponentials) are used in order to convert the geometric optimization problem into convex form.

A convex optimization problem effectively optimizes a logarithmic function in light of a plurality of other, constrained logarithmic functions. Here, optimization problems expressed in convex form are numerically easier to compute for a digital computing system (e.g., a computer) that is tailored to solve the optimization problem (e.g., through the use of a software program). Accordingly, the term "geometric problem", "geometric optimization problem" and the like is meant to include geometric problems that have been formulated in convex form. Likewise, the term monomial is meant to include monomial equations that are in a format suitable for a convex optimization problem; and, the term posynomial is meant to include posynomial equations that are in a format suitable for a convex optimization problem. Typical software approaches used to solve convex optimization problems include interior-point primal barrier methods, interior-point primal-dual methods, and infeasible primal-dual methods among others. For these or other details related to geometric programming, the reader is again referred to Duffin, Peterson and Zener "Geometric Porgramming—Theory and Application", John Wiley & Sons, New York/London/Sydney, 1967.

Figure 8:
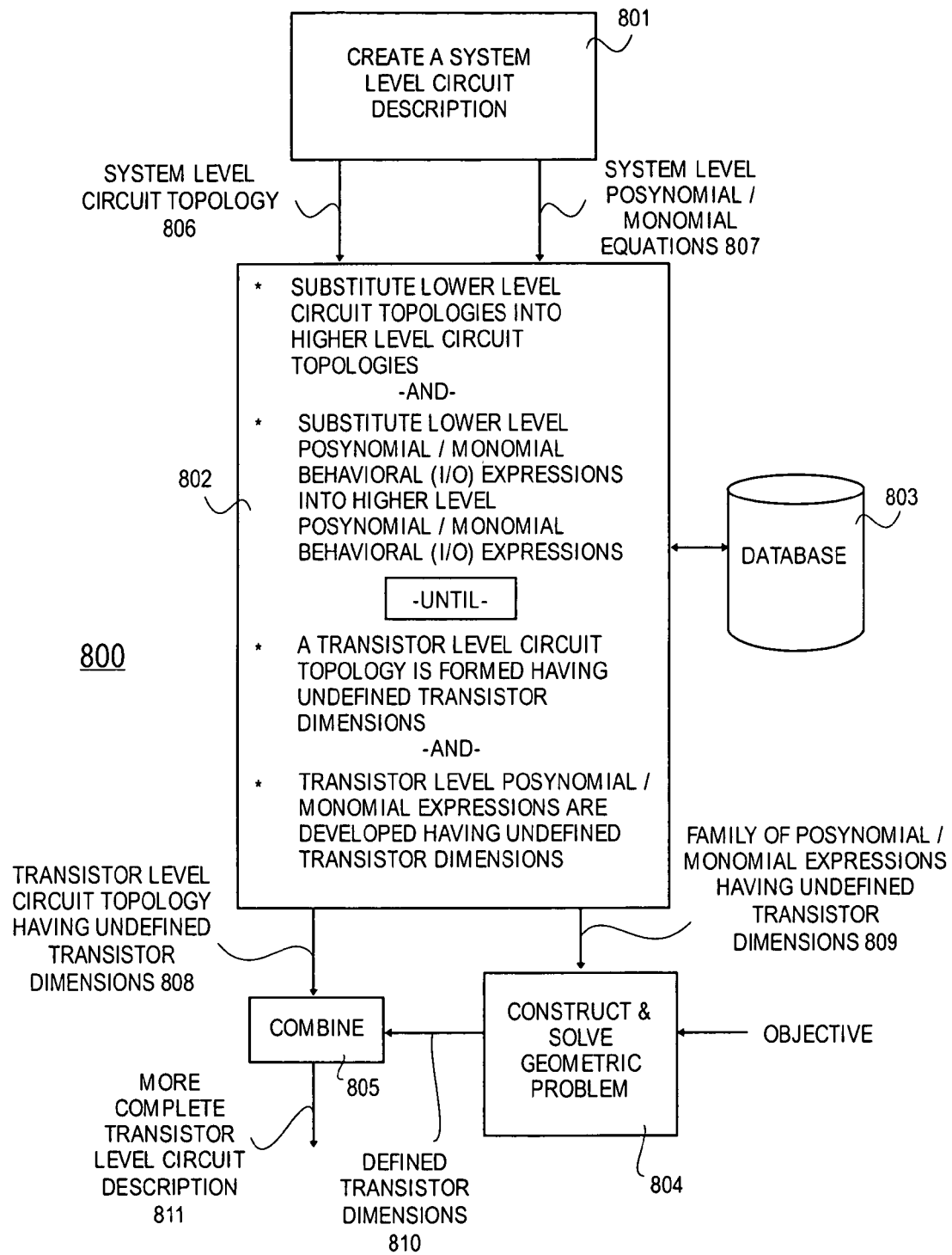
FIG. 8 shows a methodology for automatically generating a design with a geometric optimization sequence.

FIG. 8 shows an embodiment of a methodology 800 by which an automated design tool designed according to the principles expressed above may be configured to operate according to. Initially a system level description is created 801. Here, the construction of a system level description results in system level topology information 806 (e.g., such as a system level netlist) and system level monomial and/or posynomial equations 807. Here, various types of circuits may be deemed complex enough to be regarded as a system. A system is a type of circuit that is comprised of smaller groups of circuitry that themselves can be described at a level of detail that is higher than the transistor level. A PLL is a good example because most of the PLLs various sub components (e.g., the phase detector, the charge pump, the VCO) can be characterized at a level of detail that is higher than transistor level specifics. For circuits that are not systems (e.g., a low level circuit such as the amplifier of FIGS. 7a and 7b) the methodology of FIG. 8 may still be used (where a description of the lower level circuit is provided at sequence 801 instead). For simplicity, the remainder of the discussion reads as though a system is being developed.

Once the system level description has been created 801, lower level circuit topology information and monomial and posynomial expressions are substituted, respectively, into higher level circuit topology information and posynomial expressions until a transistor level circuit topology is formed having undefined transistor dimensions and transistor level posynomial expressions are developed having undefined transistor dimensions 802. The software may make use of database 803 that stores the information to be substituted into the higher level descriptions. At some point toward the end of the mathematical substitution procedure 801, the device model information is substituted into the family of equations to describe the transistors (where appropriate) in terms of the particular process that is being evaluated.

Once the transistor level has been reached, transistor level circuit topology information 808 having undefined transistor dimensions results; and, a family of monomial and posynomial equations 809 having undefined transistor dimensions is created. Then, a geometric problem is constructed and solved 804 which provides numeric details 810 that define the previously undefined transistor dimensions. A particular objective (such as minimizing a particular characteristic such as power consumption or surface are consumption) is usually articulated when constructing the geometric problem. Then, the defined transistor dimensions 810 are combined 805 with the transistor level circuit topology information (having undefined transistor level dimensions) so as to form a more complete transistor level description 811 of the circuit.

Figure 9:
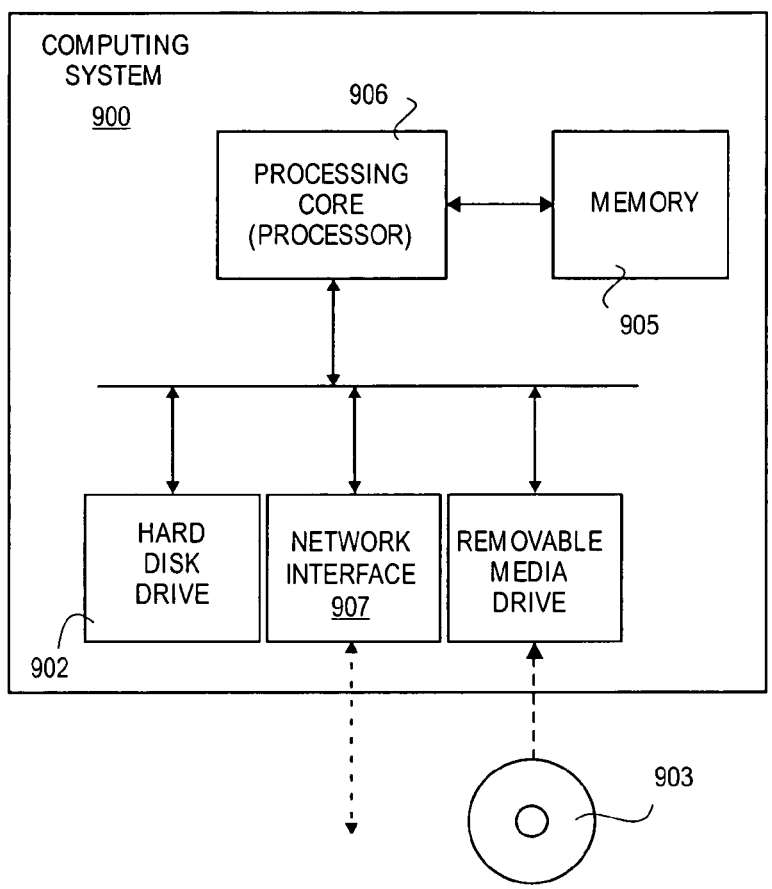
FIG. 9 shows an embodiment of a computing system.

FIG. 9 shows an embodiment of a computing system 900 that can execute instructions residing on a machine readable medium (noting that other (e.g., more elaborate) computing system embodiments are possible). The instructions may be related to integrated circuit design (e.g., such as automatic physical behavior curve generation, automatic device model generation and automatic circuit with a geometric optimization sequence as described in detail above). In one embodiment, the machine readable medium may be a fixed medium such as a hard disk drive 902. In other embodiments, the machine readable medium may be movable such as a CD ROM 903, a compact disc, a magnetic tape, etc. The instructions (or portions thereof) that are stored on the machine readable medium are loaded into memory (e.g., a Random Access Memory (RAM)) 905; and, the processing core 906 (e.g., a central processing unit comprising one or more processors) then executes the instructions. The instructions may also be received through a network interface 907 prior to their being loaded into memory 905.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

3.0 Appendices

Appendices A and B are excerpts from Maria del Mar Hershenson, "CMOS ANALOG CIRCUIT DESIGN VIA GEOMETRIC PROGRAMMING" A Dissertation Submitted To The Department Of Electrical Engineering And The Committee Of Graduate Studies Of Stanford University In Partial Fulfillment Of The Requirements For The Degree Of Doctor Of Philosophy, November 1999. The reader is referred to the complete dissertation for more details.

[0081] APPENDIX A

Monomial and Posynomial Fitting

THis appendix shows how to fit some data with monomial and posynomial expressions. We show how the monomial fitting problem can be easily reduced to a linear problem and therefore solved very efficiently.

A.1 Monomial fitting

We wish to approximate a function $f(x)$ by a monomial function $\hat{f}(x)$, where $x$ is a vector of $n$ real positive variables, $$\hat{f}(x) = \beta x_1^{\alpha_1} x_2^{\alpha_2} \cdots x_n^{\alpha_n}, \qquad (A.1)$$

where $\alpha_1, \alpha_2, \ldots, \alpha_n \in \mathbf{R}$ and $\beta \in \mathbf{R}^+$ are the function parameters. At first sight, this may seem a complicated nonlinear problem. However, this fitting problem becomes a linear problem with a simple change of variables. Taking the logarithm of both sides of equation (A.1) we obtain $$\log \hat{f}(x) = \log \beta + \alpha_1 \log x_1 + \alpha_2 \log x_2 + \cdots + \alpha_n \log x_n \qquad (A.2)$$

Defining $\alpha_0 = \log \beta$, we can write this in the form $$\log \hat{f}(x) = \begin{bmatrix} 1 & \log x_1 & \log x_2 & \cdots & \log x_n \end{bmatrix} \begin{bmatrix} \alpha_0 \\ \alpha_1 \\ \alpha_2 \\ \vdots \\ \alpha_n \end{bmatrix} \quad (A.3)$$

which is a linear function of the new parameters $y = (\alpha_0, \ldots, \alpha_n)$.

If we have $m$ sample points of $f(x)$, the problem consists in finding a value $y$ such that $f \approx \hat{f}$, $$z = \begin{bmatrix} \log f_1 \\ \vdots \\ \log f_m \end{bmatrix} \approx \begin{bmatrix} \log \hat{f}_1 \\ \vdots \\ \log \hat{f}_m \end{bmatrix} = \begin{bmatrix} 1 & \log x_{11} & \cdots & \log x_{1n} \\ \vdots & \vdots & \vdots & \vdots \\ 1 & \log x_{1m} & \cdots & \log x_{1m} \end{bmatrix} \begin{bmatrix} \alpha_0 \\ \alpha_1 \\ \alpha_2 \\ \vdots \\ \alpha_n \end{bmatrix} = Ay. \quad (A.4)$$

To find an appropriate value for $y$ we can minimize the $p$-norm of the error, $$\text{minimize } \|z - Ay\|_p,$$

where $z_i = \log f_i$.

Minimizing the $p$-norm of the error is a convex problem and can be readily solved (see [57]) for details). The error distribution depends on the norm we choose. A small $p$ puts more weight on the small errors and a large $p$ puts more weight on the large errors. We now describe the details for minimizing the 2-norm and the $\infty$-norm.

A.1.1 Minimizing the 2-norm

To minimize 2-norm, we simply solve a least-squares problem, i.e., we take $y = (A^T A)^{-1} A^T z$, where $A$ is the $m \times n$ matrix in equation (A.4).

It is important to realize that with this choice of $y$ we obtain the best fit for $\log f(x)$, not for $f(x)$. In other words, we minimize $\|\log f - \log \hat{f}\|_2$, instead of $\|\log f - \log \hat{f}\|_2$. It is interesting to see how these two fitting criteria are related. We minimize $$J = \sum_{i=1}^{m}(\log \hat{f}_i - \log f_i)^2 = \sum_{i=1}^{m}(\log(\hat{f}_i/f_i))^2.$$

For $a$ near 1 we have $\log a \approx a - 1$. Assuming the fit is good (*i.e.*, $(\hat{f}_i/f_i)) \approx 1$, we can approximate $$J \approx \sum_{i=1}^{m}(\hat{f}_i/f_i) - 1)^2 = \sum_{i=1}^{m}\left(\frac{\hat{f}_i - L_i}{f_i}\right)^2 = (1/100)^2 \sum_{i=1}^{m} e_i^2,$$

where $e_i$ is the square of the percent error for the $i$th sample. Thus, if the fit is good, the criterion we used is quite close to the sum of the squares of the percent errors.

A.1.2 Minimizing the ∞-norm

We can also minimize $\|z - Ay\|_\infty$, *i.e.*, $$\text{minimize } \max_i \left|\hat{f}_i - f_i\right|.$$

This minimization problem can be written as a linear program (see [57]):

minimize $u$ such that $\log f_i - (\alpha_0 + \alpha_1 \log x_{1i} + \cdots + \alpha_n \log x_{ni}) \leq u \quad i = 1, \ldots, m,$ (A.5)

$\log f_i - (\alpha_0 + \alpha_1 \log x_{1i} + \cdots + \alpha_n \log x_{ni}) \geq -u \quad i = 1, \ldots, m.$ Again, by solving problem (A.5), we are minimizing the maximum error for the fit of $\log f(x)$ not for $f(x)$, $$J = \max_i \left|\log \hat{f}_i - \log f_i\right| = \max_i \left|\log(\hat{f}_i/f_i)\right|.$$

By using the same approximation as before (*i.e.*, for $a \approx 1$, $\log a \approx a - 1$), we can write $$J \approx \max_i \left| \hat{f}_i/f_i - 1 \right| = \max_i \left| \frac{\hat{f}_i - L_i}{f_i} \right| = (1/100) |e_i|.$$

If the fit is good, the criterion we used is effectively to minimize the maximum absolute percent error.

A.1.3 Practical considerations

For the monomial models found in this dissertation, we have minimized the norm-$\infty$ of the error. We have solved the LPs using *MATLAB*. For a matrix $A$ of size $10^5 \times 6$, the linear problem is solved in approximately forty seconds real time on an ULTRA SPARC1 running at 170 MHz. The computation time scales linearly with the problem size, *i.e.*, a problem of size $2 \cdot 10^5 \times 6$ takes around eighty seconds.

There are much more efficient methods for solving LPs than using *MATLAB* but these alternate methods have not been investigated because the computation time was considered sufficiently short.

A.2 Posynomial fitting

The goal is now to approximate a function $f(x)$ by a posynomial function $\hat{f}(x)$, where $x$ is a vector of $n$ real positive variables.

$$\hat{f}(x) = \sum_i^m \beta_i x_1^{\alpha_{1i}} x_2^{\alpha_{2i}} \cdots x_n^{\alpha_{ni}} \tag{A.6}$$

where $\alpha_{ij} \in \mathbf{R}$ and $\beta_i \in \mathbf{R}^+$ are the function parameters. We take logarithms on both sides and, $$\log \hat{f}(x) = \log \sum_i^m e^{\bar{\alpha}_i^T \log x_i + \bar{\beta}_i}, \tag{A.7}$$

where $\log x_i = (\log x_1, \log x_2, \ldots, \log x_n)$, $\overline{\alpha}_i = (\alpha_{1i}, \alpha_{2i}, \ldots, \alpha_{ni})$, and $\overline{\beta}_i = \log \beta_i$. We can try to minimize the $\infty$-norm of the difference of $\log f$ and $\log \hat{f}$, i.e., $$\text{minimize} \max | \log f_i - \log \hat{f}_i |.$$

This problem can be written as $$\begin{aligned}
\text{minimize} \quad & u \\
\text{such that} \quad & \log f_j - \log(\sum_i^m e^{\overline{\alpha}_i^T \log x_i + \overline{\beta}_i}) \leq u \quad j = 1, \ldots, m, \\
& \log f_i - \log(\sum_i^m e^{\overline{\alpha}_i^T \log x_i + \overline{\beta}_i}) \geq -u \quad j = 1, \ldots, m.
\end{aligned} \quad (A.8)$$

Although the objective is linear and the last $m$ constraints are convex in the $\alpha_i$, the first $m$ constraints are not convex and therefore the problem is not convex. To solve problem (A.8), we use a damped Newton method with initial conditions close to the ones provided by a monomial fit. Since this problem is not convex, the result depends highly on the starting point. Thus, to obtain a good result, it is advisable to start from several different conditions.

[0082] APPENDIX B

Transistor Models for Geometric Programming

TRansistor models are a critical part of analog integrated circuit design. Circuit synthesis and analysis, both by hand and by computer, are only as accurate as the transistor models used. Not surprisingly, there has been tremendous effort on transistor modeling [123]. For hand analysis, designers use simple models and try to remember all the approximations in those models when considering the circuit behavior. For computer analysis, more accurate and sophisticated models are used (*e.g.*, *BSIM* [124]), but the complexity of the models can make simulation times long and hand analysis impractical.

Thus, the traditional trade-off in circuit modeling is between simplicity and fidelity, *e.g.*, simple but not too accurate models for hand analysis and design, versus complex, high fidelity models for design verification. Here we introduce a new quality of a circuit model, *i.e.*, whether it results in posynomial ("GP compatible") specifications. Since GPs can be solved very efficiently, model complexity is not a problem: a very complex, but posynomial model is readily handled by GP. Therefore, we have a trade-off between monomial/posynomial models (for design via GP) and fidelity or accuracy.

In this chapter we consider several GP compatible models. We begin with a description of the *GP0* model, a transistor model for long channel transistors. We continue by describing the *GP1* model, a model suitable for short channel transistors. We end the chapter by illustrating the *GP2* model, a more complex but also more accurate transistor model. We have found out that current CMOS technologies can be modeled with sufficient accuracy by posynomial models.

All through this chapter we will only consider models for CMOS transistors operating in the saturation region. The same modeling techniques can be applied to transistors operating in the linear region. Also, we only show the equations of NMOS devices. The PMOS devices have very similar equations, with only different signs in the bias conditions.

3.1 *GP0* model

The *GP0* model represents the behavior of long channel MOSFETs in saturation. It is slightly simpler than the SPICE *Level 1* model. The transistor operation is determined by its dimensions and its terminal voltages. The *GP0* model does not account for dependence on the drain and bulk voltages, *i.e.*, it assumes that the transistor operation is only set by its dimensions and by the gate to source voltage.

We start by describing the large signal model and then continue with the small signal model.

3.1.1 Large signal model

The condition for an NMOS transistor to be in saturation is $$V_{DS} \geq V_{GS} - V_{TN}. \tag{3.1}$$

When this condition holds, the drain current can be expressed as $$I_D = \frac{1}{2}\mu C_{ox}\frac{W}{L}(V_{GS} - V_{TN})^2(1 + \lambda V_{DS}), \tag{3.2}$$

where $L$ is the transistor channel length, $W$ is the transistor width, $\mu$ is the electron mobility, $C_{ox}$ is the oxide capacitance per unit area, $V_{TN}$ is the NMOS threshold voltage, and $\lambda$ is the channel-length modulation parameter. Typically the product $\lambda V_{DS}$ is small and channel-length modulation can be ignored in equation (3.2), and the drain current expression is given by the monomial, $$I_D = \frac{1}{2}\mu C_{ox}\frac{W}{L}(V_{GS} - V_{TN})^2. \tag{3.3}$$

The gate overdrive is given by the monomial expression, $$V_{ov} = |V_{GS} - V_{TN}| = \sqrt{\frac{2IL}{\mu C_{ox} W}}. \tag{3.4}$$

3.1.2 Small signal model

Figure 10:
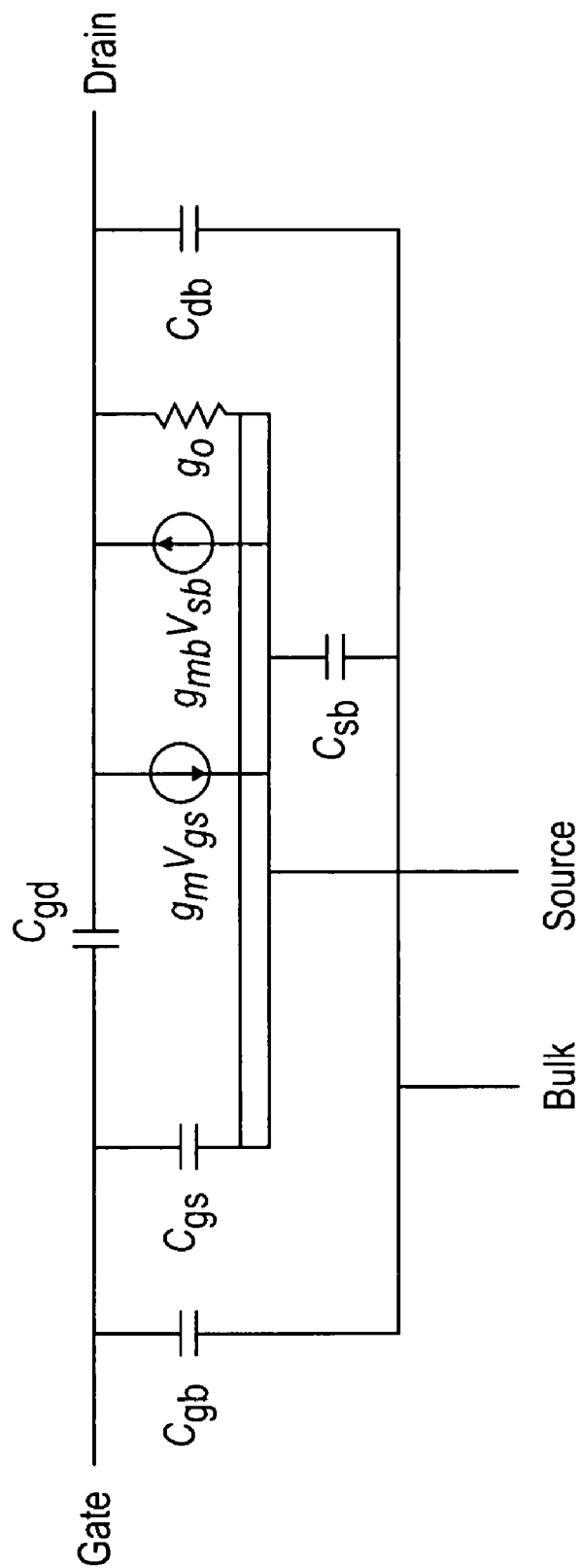
FIG. 10 shows a small signal model for a MOSFET.

Figure 10 shows the small signal model around the operating point for a MOSFET transistor in saturation. The static elements are the transconductance ($g_m$), the body effect transconductance ($g_{mb}$), and the output conductance ($g_o$). The dynamic elements are the gate to source capacitance ($C_{gs}$), the drain to gate capacitance ($C_{gd}$), the drain to bulk capacitance ($C_{db}$), the source to bulk capacitance ($C_{sb}$), and the gate to bulk capacitance ($C_{gb}$). We now show that all of the small signal model elements can be expressed as either PSfrag replacements monomial or posynomial functions of the design variables.

3.1.2.1 Static elements

The static elements in the transistor model are a series of conductances.

- Transconductance ($g_m$)

The transconductance is given by the monomial expression, $$g_m = \frac{\partial I}{\partial V_{GS}} = \sqrt{2\mu C_{ox} I \frac{W}{L}}, \qquad (3.5)$$

where channel-length modulation effects have been ignored. This introduces a small error but simplifies the expression considerably.

- Body effect transconductance ($g_{mb}$)

The body effect transconductance is given by $$g_{mb} = \eta g_m, \qquad (3.6)$$

where $\eta$ is assumed constant. In current process technologies $\eta$ takes a value between 0.1 and 0.3.

- Output conductance ($g_o$)

The output conductance is also given by a monomial expression, $$g_o = \frac{\partial I}{\partial V_{DS}} = \lambda I. \qquad (3.7)$$

Note that we ignore channel-length modulation in our transconductance expression, but must include it in the output conductance expression (which would otherwise be zero).

3.1.2.2 Dynamic elements

Several capacitances are needed to model the dynamic behavior of the transistor.

- Gate to bulk capacitance ($C_{gb}$)

When the transistor is in saturation, this capacitance is negligible and we can assume it zero, *i.e.*, $$C_{gb} = 0. \tag{3.8}$$

- Gate to source capacitance ($C_{gs}$)

The gate to source capacitance is given by the sum of the gate oxide capacitance and the overlap capacitance, $$C_{gs} = \frac{2}{3} C_{ox} W L + C_{ox} W L_D, \tag{3.9}$$

where $L_D$ is the source lateral diffusion.

- Gate to drain capacitance ($C_{gd}$)

The gate to drain capacitance is due to the overlap capacitance and is given by the monomial $$C_{gd} = C_{ox} W L_D. \tag{3.10}$$

- Source to bulk capacitance ($C_{sb}$)

The source to bulk capacitance is a junction capacitance and can be expressed as $$C_{sb} = \frac{C_{sb0}}{\left(1 + \frac{V_{SB}}{\psi_o}\right)^{\frac{1}{2}}}, \tag{3.11}$$

where $\psi_o$ is the junction built-in potential, $L_s$ is the source diffusion length, and $C_{sb0}$ is given by $$C_{sb0} = C_j L_s W + C_{jsw}(2 L_s + W), \tag{3.12}$$

where $C_j$ is the zero-bias bulk junction bottom capacitance per area and $C_{jsw}$ is the zero-bias bulk sidewall junction capacitance per unit area.

- Drain to bulk capacitance ($C_{db}$)

The drain to bulk capacitance is also a junction capacitance, given by $$C_{db} = \frac{C_{db0}}{\left(1 + \frac{V_{DB}}{\psi_o}\right)^{\frac{1}{2}}}, \qquad (3.13)$$

where $C_{db0} = C_{sb0}$ for equal source and drain diffusion areas. The expressions for the junction capacitances (3.11) and (3.13) are not posynomial, except in the special case where $V_{SB}$ and $V_{DB}$ do not depend on the design variables. We can take several approaches to approximating these capacitances. One simple method is to take a worst-case analysis, *i.e.*, to take the values of $V_{SB}$ and $V_{DB}$ that make these capacitances largest. This way we obtain a pessimistic estimate of performance specifications such as bandwidth, slew rate, phase margin, *etc*. This worst-case value corresponds to $V_{SB} = 0$ and $V_{DB} = 0$.

Another option is to estimate the various junction voltages with a constant voltage, so that (3.11) and (3.13) do not depend on $V_{SB}$ and $V_{DB}$. For example, if a transistor is diode connected, its drain to source voltage will be roughly a threshold voltage and a few hundred millivolts of gate overdrive.

One can also decide to consider the voltages $V_{SB}$ and $V_{DB}$ design variables. We have observed that this complicates the problem considerably in exchange for only a slight increase in accuracy.

We summarize the transistor *GP0* model characteristics in Table 3.1.

| Element | Type |
|---|---|
| Gate overdrive | Monomial |
| Transconductance | Monomial |
| Body effect transconductance | Monomial |
| Output conductance | Monomial |
| Gate to source capacitance | Posynomial |
| Gate to drain capacitance | Monomial |
| Source to bulk capacitance | Posynomial |
| Drain to bulk capacitance | Posynomial |

Table 3.1: Nature of elements in the *GP0* model.

3.2 *GP1* model

The *GP0* model represents the behavior of a long channel transistor. However, to model short channel transistors we need a somewhat more complex model. This transistor model, which we call a *GP1* model, has the following form.

3.2.1 Large signal model

The condition for an NMOS transistor to be in saturation is $$V_{DS} \geq V_{GS} - V_{TN}. \tag{3.14}$$

When this condition is true, the gate overdrive voltage is given by a monomial function of transistor length $L$, transistor width $W$, and transistor drain current $I_D$, $$V_{ov} = K_\alpha I_D^{\alpha_I} L^{\alpha_L} W^{\alpha_W}. \tag{3.15}$$

3.2.2 Small signal model

3.2.2.1 Static elements

- Transconductance ($g_m$)

The transconductance is given by a monomial function of $L$, $W$, and $I_D$, $$g_m = K_\beta I_D^{\beta_I} L^{\beta_L} W^{\beta_W}. \tag{3.16}$$

- Body effect transconductance ($g_{mb}$)

The body effect conductance is given by a monomial function of $L$, $W$, and $I_D$, $$g_{mb} = K_\gamma I_D^{\gamma_I} L^{\gamma_L} W^{\gamma_W}. \tag{3.17}$$

- Output conductance ($g_o$)

The output conductance is given by $\alpha g_{o,m}$, where $g_{o,m}$ is monomial in $L$, $W$, and $I_D$, and $\alpha$ is a constant. We use two different values of $\alpha$, depending on whether the transistor in question typically operates with large or small $V_{DS}$. It has the form, $$g_o = \alpha g_{m,o} = \alpha_{go,i} K_\eta I_D^{\eta_I} L^{\eta_L} W^{\eta_W}. \tag{3.18}$$

3.2.2.2 Dynamic elements

The small-signal model capacitances are posynomial in $L$, $W$, and $I_D$, and have the same expression as in the *GP0* model.

Note that the *GP1* model design variables ($W$, $I_D$, and $L$) are also the same as in the *GP0* model. It is interesting to note that the traditional long channel MOS transistor model fits exactly the format of the *GP1* model (see [125]). For example, the coefficients in the transconductance expression (3.16) have values of $\pm 0.5$ in a long channel model, $$g_m = K_\beta I_D^{\beta_I} L^{\beta_L} W^{\beta_W} = K_\beta I_D^{0.5} L^{-0.5} W^{0.5}.$$

When we use expression (3.16) to model a short channel transistors, the exponents $\beta_I$, $\beta_L$, and $\beta_W$ do not need to be $\pm 0.5$. This gives us more flexibility to model the transistor behavior (see §3.2.3). The *GP1* model parameters ($K_i$, $\alpha_i$, $\beta_i$, $\gamma_i$, and $\eta_i$) can be found by simple and efficient linear data techniques that are described in detail in §A. We

| Element | Type |
|---|---|
| Gate overdrive | Monomial |
| Transconductance | Monomial |
| Body effect transconductance | Monomial |
| Output conductance | Monomial |
| Gate to source capacitance | Posynomial |
| Gate to drain capacitance | Monomial |
| Source to bulk capacitance | Posynomial |
| Drain to bulk capacitance | Posynomial |

Table 3.2: Nature of elements in the *GP1* model.

can obtain *GP1* models that have reasonable agreement with SPICE higher order models (*BSIM* models), over large ranges of length, width, and bias currents. We summarize the transistor *GP1* model characteristics in Table 3.2.

3.2.3 *GP1* model example

In this example we show equations for the *GP1* model of the transconductance of an NMOS transistor in a 0.5$\mu$m CMOS technology (AMI 0.5$\mu$m). We model the transconductance for transistors operating in the saturation region, with widths ranging from 2$\mu$m to 500$\mu$m, lengths ranging from 0.5$\mu$m to 10$\mu$m, gate overdrives ranging from 100mV to 2.5V, drain to source voltage ranging from 200mV to 2.5V, and bulk and source tied together. A total of 6,000 different data points were used to generate the *GP1* model. We obtain the following equation $$g_m = 1.858 \cdot 10^{-2} \cdot W^{0.570} L^{-0.480} I_D^{0.434},$$

where the transconductance is given in siemens, the width and length are in $\mu$m, and the current is in amps.

Figure 11:
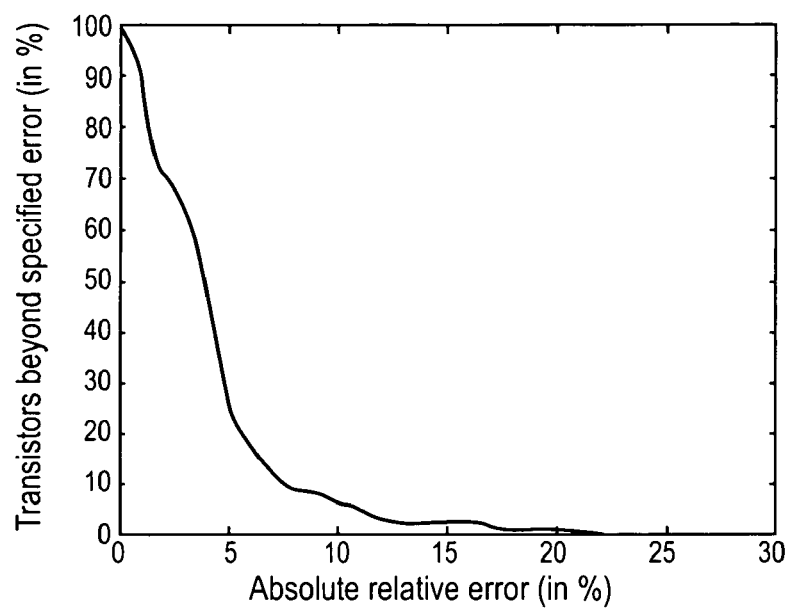
FIG. 11 shows error distribution for the GP1 model of the transconductance of an NMOS transistor in a 0.5 um CMOS technology when compared to SPICE simulations with BSIM3v1 models.

The *GP1* model is compared to a *BSIM3v1* SPICE model [124] in Figure 11. Throughout this work we use the simulator *HSPICE*, which is a commercial version of SPICE (see [126] for details). We define the absolute percentage error of an approximation $\hat{g}_m$ of an transconductance $g_m$ as $100|\hat{g}_m - g_m|/g_m$. The horizontal axis gives an absolute The maximum error is given by the point where the curve hits the $x$-axis. The plots show that the typical errors are in the 4% range, and most of the errors are smaller than 10%.

Note also that although the equation for the transconductance does not depend on $V_{DS}$, the expression has been tested for a large range of $V_{DS}$. Since the errors obtained are small, we conclude that in this process the transconductance for a device operating in the saturation region only depends slightly on $V_{DS}$ and the *GP1* model for $g_m$ is appropriate. In the next section, we show more accurate and complex models for the same process.

percentage error level, and the vertical axis shows the fraction of transistors with error exceeding the specified level. Roughly speaking, the closer the error distribution curve to the y-axis, the more accurate the expression. We can determine several important statistics from the curves. By following the horizontal line at the 50% level, we can read off the median error for each approximation. By following a vertical line at some level of error, we can find the fraction of transistors for which the approximation is at least that accurate.

3.3 GP2 model

The *GP2* transistor model provides a more accurate representation of the transistor behavior at the cost of a small increase in complexity. This model is useful for describing very short channel transistors ($L \leq 0.5\mu$m). The *GP2* transistor model has the following form.

3.3.1 Large signal model

The condition for an NMOS transistor to be in saturation is $$V_{DS} \geq V_{GS} - V_{TN}. \quad (3.19)$$

When the transistor is in saturation, the gate overdrive voltage is expressed as a posynomial function of the transistor length $L$, transistor width $W$, transistor drain current $I_D$, drain to source voltage, $V_{DS}$, and source to bulk voltage, $V_{SB}$, $$V_{ov} = |V_{GS} - V_{TN}| = \sum_i K_{\alpha,i} I_D^{\alpha_{I,i}} L^{\alpha_{L,i}} W^{\alpha_{W,i}} V_{DS}^{\alpha_{Vd,i}} V_{SB}^{\alpha_{Vb,i}}. \quad (3.20)$$

In practice, we have found that with only one monomial term we can represent the gate transconductance quite accurately. Of course, one can use more terms and obtain a more accurate error. However, having a one term expression for the gate overdrive, means that we can conveniently find an expression for the drain current in saturation region, namely, $$V_{ov} = K_\alpha I_D^{\alpha_I} L^{\alpha_L} W^{\alpha_W} V_{DS}^{\alpha_{Vd}} V_{SB}^{\alpha_{Vb}}$$
$$I_D = \left(\frac{1}{K_\alpha}\right)^{1/\alpha_I} V_{ov}^{1/\alpha_I} L^{-\alpha_L/\alpha_I} W^{-\alpha_W/\alpha_I} V_{DS}^{-\alpha_{Vd}/\alpha_I} V_{SB}^{-\alpha_{Vb}/\alpha_I}.$$

3.3.2 Small signal model

3.3.2.1 Static elements

- Transconductance ($g_m$)

Instead of modeling the transconductance directly, we model the inverse of the transconductance. The inverse of the transconductance is given by a posynomial function of $L$, $W$, $I_D$, $V_{DS}$, and $V_{SB}$, $$1/g_m = \sum_i K_{\beta,i} I_D^{\beta_{I,i}} L^{\beta_{L,i}} W^{\beta_{w,i}} V_{DS}^{\beta_{Vd,i}} V_{SB}^{\beta_{Vb,i}}. \tag{3.21}$$

- Body effect transconductance ($g_{mb}$)

Again, instead of modeling the body effect transconductance, we model directly the inverse of the body effect conductance with a posynomial function of $L$, $W$, $I_D$, $V_{DS}$, and $V_{SB}$, $$1/g_{mb} = \sum_i K_{\gamma,i} I_D^{\gamma_{I,i}} L^{\gamma_{L,i}} W^{\gamma_{w,i}} V_{DS}^{\gamma_{Vd,i}} V_{SB}^{\gamma_{Vb,i}}. \tag{3.22}$$

- Output conductance ($g_o$)

The output conductance $g_o$ is given by a posynomial in $L$, $W$, $I_D$, $V_{DS}$, and $V_{SB}$, $$g_o = \sum_i K_{\eta,i} I_D^{\eta_{I,i}} L^{\eta_{L,i}} W^{\eta_{w,i}} V_{DS}^{\eta_{Vd,i}} V_{SB}^{\eta_{Vb,i}}. \tag{3.23}$$

3.3.2.2 Dynamic elements

- Capacitances $C_{gb}$, $C_{gs}$, and $C_{gd}$ are posynomial in $L$ and $W$, and have the same form as in the *GP0* model, namely, $$C_{gb} = 0 \tag{3.24}$$
$$C_{gs} = \sum_i K_{\mu,i} L^{\mu_{L,i}} W^{\mu_{w,i}} \tag{3.25}$$
$$C_{gd} = \sum_i K_{\nu,i} L^{\nu_{L,i}} W^{\nu_{w,i}}. \tag{3.26}$$

- Source to bulk capacitance ($C_{sb}$)

The source to bulk capacitance is given by a posynomial in $L$, $W$, $I_D$, and $V_{SB}$, $$C_{sb} = \sum_i K_{\epsilon,i} L^{\epsilon_{L,i}} W^{\epsilon_{W,i}} V_{SB}^{\epsilon_{V_{s,i}}}. \qquad (3.27)$$

- Drain to bulk capacitance ($C_{db}$)

The drain to bulk capacitance is given by a posynomial in $L$, $W$, $I_D$, and $V_{DB}$, $$C_{db} = \sum_i K_{\lambda,i} L^{\lambda_{L,i}} W^{\lambda_{W,i}} V_{DB}^{\lambda_{V_{d,i}}}. \qquad (3.28)$$

Note that the *GP2* model elements depend on the four terminal voltages of the transistor. This is a substantial difference with respect to the *GP0* and *GP1* models. It represents more accurately the transistor behavior although it complicates somewhat the design equations.

It is important to note that unlike the parameters of the *GP1* model, which can be found very easily by solving a linear problem, the parameters for the *GP2* model are quite hard to find and require solving a complex nonlinear nonconvex optimization problem (see §A). In practice, this can become a big disadvantage, and one may decide to use *GP1* models just to avoid the tedious computation of *GP2* model parameters. We summarize the transistor *GP2* model characteristics in Table 3.3.

| Element | Type |
|---|---|
| Gate overdrive | Posynomial |
| Transconductance | Inverse-posynomial |
| Body effect transconductance | Inverse-posynomial |
| Output conductance | Posynomial |
| Gate to source capacitance | Posynomial |
| Gate to drain capacitance | Monomial |
| Source to bulk capacitance | Posynomial |
| Drain to bulk capacitance | Posynomial |

Table 3.3: Nature of elements in the *GP2* model.

3.3.3 GP2 model example

We now give an example of the *GP2* model for an NMOS transistor in the same 0.5μm CMOS process discussed in §3.2.3. The range for the transistor dimensions and operating conditions is also the same as the one in §3.2.3.

Figure 12:
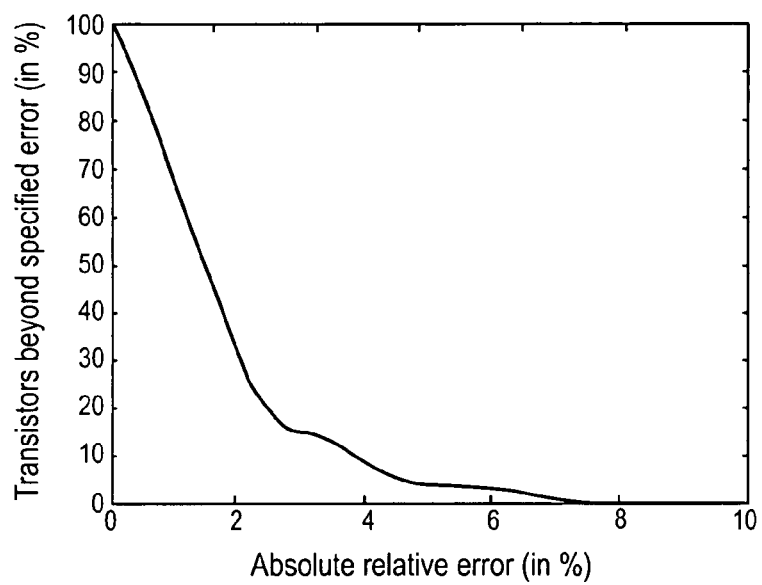
FIG. 12 shows error distribution for the GP2 model of the gate overdrive of an NMOS transistor in 0.5 um CMOS technology when compared to SPICE simulations with BSIM3v1 models.

The expression for the gate overdrive for an NMOS transistor operating in the saturation region is given by the monomial, $$V_{ov} = 1.671 \cdot 10^2 \cdot W^{-0.560} L^{0.523} I_D^{0.555} V_{DS}^{-0.012},$$

where the gate overdrive is given in volts, the width and length are in μm, the current is in amps, and the voltage in volts. The accuracy of the *GP2* gate overdrive model is compared to a *BSIM3v1* model in Figure 12. The meaning of this curve has been explained in §3.2.3. The typical errors are around 1.8% and maximum errors are 10%.

In Figure 13 we show some curves of drain current versus gate to source voltage for NMOS transistor widths of 100μm, 200μm, and 300μm, length of 1μm, and drain to source voltage of 2.5V. The triangles represent the data from *BSIM3v1* SPICE models and the circles represent the predicted data from the *GP2* model. In Figure 3.5 we show some curves of drain current versus drain to source voltage for an NMOS transistor of width of 200μm, length of 1μm, and gate to source voltage of 1V, 1.5V, and 1.85V. Note that there is little difference between the *GP2* model and the *BSIM3v1* SPICE model when the transistor is operating in the saturation region. To model the transistor operation in the linear region, we need to find a monomial or posynomial expression for the drain current in terms of the transistor dimensions and terminal voltages in that region of operation. This is done with the same data fitting techniques. As we will see in the next chapters, in the circuits we will describe, we have found little use for linear region models since we have dealt almost entirely with transistors operating in the saturation region.

The expression for the transconductance in the GP2 model is given by $$1/g_m = 56.220 \cdot W^{-0.533} L^{0.547} I_D^{-0.442} V_{DS}^{-0.009} +$$
$$34.461 \cdot W^{-0.581} L^{0.528} I_D^{-0.375} V_{DS}^{-0.014} +$$
$$70.883 \cdot W^{-0.526} L^{0.561} I_D^{-0.458} V_{DS}^{-0.011},$$

where the transconductance is given in siemens, the width and length are in μm, the current is in amps, and the voltage in volts. The accuracy of the GP2 transconductance model is compared to a BSIM3v1 transconductance model in Figure 15. Note that by adding two more monomial terms to the transconductance model, the error distribution is improved considerably. Now the typical errors are around 1% and maximum errors are 4%, compared to typical errors of 4% and maximum errors of 20% for a GP1 model.

In Figure 16 we show some curves of transconductance versus gate to source voltage for widths of 10μm, 17μm, and 28μm, lengths of 0.7μm, and drain to source voltage of 1V. The triangles represent the data from BSIM3v1 SPICE models and the circles represent the predicted data by the GP2 model.

The expression for the output conductance in GP2 model is given by $$g_o = 5.134 \cdot 10^{-5} \cdot W^{0.436} L^{-0.380} I_D^{0.626} V_{DS}^{-0.113} +$$
$$2.245 \cdot 10^{-4} \cdot W^{0.2444} L^{-0.238} I_D^{0.883} V_{DS}^{-0.744} +$$
$$2.458 \cdot 10^{-5} \cdot W^{0.402} L^{-0.432} I_D^{0.710} V_{DS}^{-0.395} +$$
$$4.031 \cdot 10^{-3} \cdot W^{-0.108} L^{0.020} I_D^{1.238} V_{DS}^{-1.598} +$$
$$1.527 \cdot 10^{-5} \cdot W^{0.448} L^{-0.504} I_D^{0.496} V_{DS}^{-0.08} +$$
$$4.638 \cdot 10^{-1} \cdot W^{-0.723} L^{0.444} I_D^{1.796} V_{DS}^{-2.728},$$

where the units are the same as for the transconductance equation. The error distribution for this model is shown in Figure 17. The typical error is approximately 2% and the maximum error is around 7%. To achieve this good fit we required a *GP2* model with six terms, double the number of terms of the *GP2* model for the transconductance. In general, we have observed that the model for the output conductance is more complex than the one for the transconductance. This is also true for non-GP models. In Figure 18 we plot the output conductance versus drain current for widths $10\mu m$, $17\mu m$, $28\mu m$, $46\mu m$, and $77\mu m$, lengths of $0.7\mu m$, and drain to source voltage of 1V. The triangles represent the data from *BSIM3v1* SPICE models and the circles represent the predicted data from the *GP2* model. Again, we observe that the *GP2* model is able to match *BISM3v1* model quite well.

3.4 Summary

In this chapter we have described several transistor models compatible with geometric programming. These models are analytical (*i.e.*, not based on a look-up table), simple and accurate.

Even more refined posynomial models can be designed. For example, we can have binned models, where each of several different models cover a specific region of operation. We can have models for low current operation, for low voltage operation, for wide transistors, *etc.* Although binning is possible, it is our experience that current CMOS technologies (feature size greater than $0.25\mu m$) can be described very well with a single bin *GP2* model.

The circuit design and optimization method that we will describe in the next chapters relies on having posynomial models for the transistors and the commonly used *BSIM* models are clearly non-posynomial. The answer to whether it is worth developing new transistor models is clearly yes. As we will see, the advantages of using geometric programming for design are very substantial. *GP* models are sufficiently accurate and can be obtained automatically with the simple fitting techniques described in §A. It does not mean that *BSIM* models should be abandoned. In fact, *GP* models should be used for synthesis while *BSIM* or other standard models should be used for verification with SPICE. In the remainder of this work, we have used *GP1* models for the transistors unless specified otherwise.

The invention claimed is:

1. A method, comprising:
executing a first continuous software process that includes:
automatically generating a first physical behavior curve from a first process description, said first process description describing a first process;
automatically generating a first device model for said first process from said first physical behavior curve, said first device model represented in geometric form;
automatically generating, with said first device model and with a first geometric optimization sequence, a first circuit design for said first process;
determining if said first circuit design meets one or more functional characteristics:
executing a second continuous software process that includes:
automatically generating a second physical behavior curve from a second process description, said second process description describing a second process;
automatically generating a second device model from said second physical behavior curve, said second device model for said second process, said second device model represented in geometric form;
automatically generating, with said second device model and with a second geometric optimization sequence, a second circuit design, said second circuit design for said second process; and
determining if said second circuit design meets one or more functional characteristics.

2. The method of claim 1 further comprising analyzing said first circuit design.

3. The method of claim 1 further comprising determining a change to said first process, said second process description describing said first process altered by said change.

4. The method of claim 1 further comprising fetching said second process description from a database prior to said automatic generating of said second physical behavior curve.

5. The method of claim 1 wherein said determining if said first circuit design meets one or more functional characteristics further comprises automatically generating, with said first device model and with a plurality of geometric optimization sequences, a plurality of circuit designs for said first process, and determining if said plurality of circuit designs meets one or more functional characteristics.

6. The method of claim 5 wherein said plurality of circuit designs are from a design library.

7. The method of claim 5 wherein said determining if said second circuit design meets one or more functional characteristics further comprises automatically generating, with said second device model and with a second plurality of geometric optimization sequences, a plurality of circuit designs for said second process, and determining if said plurality of circuit designs meets one or more functional characteristics.

8. The method of claim 7 wherein said plurality of circuit designs for said first process and said plurality of designs for said second process are from the same design library.

9. The method of claim 1 further comprising measuring another physical behavior curve for said second process from a wafer fabricated according to said second process.

10. The method of claim 9 further comprising:
automatically generating another device model for said second process from said another physical behavior curve, said another device model represented in geometric form;
automatically generating, with said another device model and with another geometric optimization sequence, another circuit design for said second process; and
determining if said circuit design meets one or more functional characteristics.

11. The method of claim 1 wherein said first device model further comprises a posynomial equation.

12. The method of claim 1 wherein said second device model further comprises a monomial equation.

13. A method, comprising:
executing a first continuous software process that includes a1), b1) and c1) below:
a1) automatically generating a first physical behavior curve from a first process description, said first process description describing a first process;
b1) automatically generating a first device model for said first process from said first physical behavior curve, said first device model represented in geometric form;
c1) automatically generating, with said first device model and with a geometric optimization sequence, a first circuit design for said first process;
d1) determining if said first circuit design meets one or more functional characteristics;
articulating a process change for said first process;
generating a second process description, said second process description describing a second process, said second process corresponding to said first process altered by said change;
executing a second continuous software process that includes a2), b2) and c2) below:
a2) automatically generating a second physical behavior curve from said second process description;
b2) automatically generating a second device model from said second physical behavior curve, said second device model for said second process, said second device model represented in geometric form; and
c2) automatically generating, with said second device model and with a second geometric optimization sequence, a second circuit design, said second circuit design for said second process;
d2) determining if said second circuit design meets one or more functional characteristics.

14. The method of claim 13 wherein said first circuit could not meet one or more functional characteristics.

15. The method of claim 14 wherein said process change is to cause a solution to be found by said second geometric optimization sequence.

16. The method of claim 13 further comprising analyzing said first circuit design prior to said articulating.

17. The method of claim 16 wherein said analyzing further comprises simulating the operation of said first circuit design.

18. The method of claim 13 wherein said determining if said first circuit design meets one or more functional characteristics further comprises automatically generating, with said first device model and with a plurality of geometric optimization sequences, a plurality of circuit designs for said first process, and determining if said plurality of circuit designs meet one or more functional characteristics.

19. The method of claim 18 wherein said determining if said second circuit design meets one or more functional characteristics further comprises automatically generating, with said second device model and with a second plurality of geometric optimization sequences, a plurality of circuit designs for said second process, and determining if said plurality of circuit designs meet one or more functional characteristics.

20. The method of claim 13 further comprising measuring another physical behavior curve for said second process from a wafer fabricated according to said second process.

21. The method of claim 20 further comprising:
automatically generating another device model for said second process from said another physical behavior curve, said another device model represented in geometric form; and
automatically generating, with said another device model and with another geometric optimization sequence, another circuit design for said second process; and
determining if said circuit design meets one or more functional characteristics.

22. A method, comprising:
executing a continuous software process that includes:
automatically generating a first physical behavior curve from a first process description, said first process description describing a first process;
automatically generating a first device model for said first process from said first physical behavior curve, said first device model represented in geometric form;
automatically generating, with said first device model and with a plurality geometric optimization sequences, a first plurality of circuit designs for said first process;
determining if said first plurality circuit design meets one or more functional characteristics;
fetching a second process description, said second process description describing a second process;
automatically generating a second physical behavior curve from said second process description;
automatically generating a second device model from said second physical behavior curve, said second device model for said second process, said second device model represented in geometric form; and
automatically generating, with said second device model and with a second plurality of geometric optimization sequences, a second plurality of circuit designs, said second plurality of circuit designs for said second process; and
determining if said second plurality of circuit design meets one or more functional characteristics.

23. The method of claim 22 wherein said fetching a second process description further comprises fetching said second process description from a database.

24. The method of claim 22 wherein said first process is a first manufacturer's process and said second process is a second manufacturer's process.

25. The method of claim 24 further comprising analyzing said first plurality of circuit designs and said second plurality of circuit designs to compare said first manufacturer's process to said second manufacturer's process.

26. The method of claim 22 wherein said second plurality of circuit designs are of the same type as those of said first plurality of circuit designs.

27. The method of claim 22 wherein said second plurality of circuit designs are of the same types as those of said first plurality of circuit designs.

28. The method of claim 22 further comprising measuring another physical behavior curve for said second process from a wafer fabricated according to said second process.

29. The method of claim 28 further comprising:
automatically generating another device model for said second process from said another physical behavior curve, said another device model represented in geometric form; and
automatically generating, with said another device model and with another geometric optimization sequence, another circuit design for said second process; and
determining if said circuit design meets one or more functional characteristics.

30. A method, comprising:
executing a continuous software process that includes:
automatically generating a physical behavior curve from a process description, said process description describing a process;
automatically generating a device model for said process from said physical behavior curve, said device model represented in geometric form;
automatically generating, with said device model and with a geometric optimization sequence, a circuit design for said process; and
determining if said circuit design meets one or more functional characteristics.

* * * * *